United States Patent
Enoki et al.

(10) Patent No.: US 10,020,347 B2
(45) Date of Patent: Jul. 10, 2018

(54) SOLID-STATE IMAGE PICKUP DEVICE AND ELECTRONIC APPARATUS

(71) Applicant: Sony Corporation, Tokyo (JP)

(72) Inventors: Osamu Enoki, Kanagawa (JP); Toru Udaka, Kanagawa (JP); Masaki Murata, Tokyo (JP); Rui Morimoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 97 days.

(21) Appl. No.: 14/087,430

(22) Filed: Nov. 22, 2013

(65) Prior Publication Data
US 2014/0160327 A1   Jun. 12, 2014

(30) Foreign Application Priority Data

Dec. 7, 2012 (JP) ................................. 2012-267867

(51) Int. Cl.
| | |
|---|---|
| H04N 5/369 | (2011.01) |
| H01L 27/30 | (2006.01) |
| H01L 51/44 | (2006.01) |
| H04N 5/225 | (2006.01) |
| H01L 51/00 | (2006.01) |

(52) U.S. Cl.
CPC .......... *H01L 27/307* (2013.01); *H01L 51/003* (2013.01); *H01L 51/448* (2013.01); *H04N 5/2253* (2013.01); *H04N 5/369* (2013.01); *Y02E 10/549* (2013.01); *Y02P 70/521* (2015.11)

(58) Field of Classification Search
CPC ....... G02B 26/0875; G02B 27/28; G02B 3/14
See application file for complete search history.

(56) References Cited

U.S. PATENT DOCUMENTS

| | | | |
|---|---|---|---|
| 2003/0209651 A1* | 11/2003 | Iwasaki ................. | H01L 27/302 250/214.1 |
| 2004/0037457 A1* | 2/2004 | Wengender ........... | G06T 7/0002 382/141 |
| 2005/0030408 A1* | 2/2005 | Ito ........................ | H04N 5/2253 348/340 |
| 2007/0132089 A1* | 6/2007 | Jiang ..................... | H01L 23/16 257/700 |
| 2007/0228502 A1* | 10/2007 | Minamio .......... | H01L 27/14618 257/431 |

(Continued)

FOREIGN PATENT DOCUMENTS

| | | |
|---|---|---|
| JP | 2004-63776 A | 2/2004 |
| JP | 2006-90983 A | 4/2006 |

(Continued)

*Primary Examiner* — Amy Hsu
(74) *Attorney, Agent, or Firm* — Chip Law Group

(57) ABSTRACT

Image sensors, electronic apparatuses, and methods of manufacturing an image sensor are provided. More particularly, an image sensor having a plurality of photoelectric conversion elements included in a laminated body is provided. At least one of the photoelectric conversion elements includes organic photoelectric conversion elements. In addition, at least a first surface of the laminated body includes a curved light incident surface, which further includes a concave surface. The plurality of photoelectric conversion elements receive light through the concave light incident surface. The laminated body can be connected to a support structure.

17 Claims, 19 Drawing Sheets

(56) References Cited

U.S. PATENT DOCUMENTS

| | | | |
|---|---|---|---|
| 2008/0225142 A1* | 9/2008 | Goto | H01L 27/14621 348/272 |
| 2008/0237443 A1* | 10/2008 | Oliver | H01L 27/14618 250/200 |
| 2009/0115875 A1* | 5/2009 | Choi | H01L 27/14618 348/294 |
| 2009/0166512 A1* | 7/2009 | Furst | B82Y 10/00 250/208.1 |
| 2010/0025789 A1* | 2/2010 | Imai | H01L 27/14618 257/432 |
| 2011/0032376 A1* | 2/2011 | Takizawa | H01L 27/14627 348/222.1 |
| 2011/0228150 A1* | 9/2011 | Takata | H01L 27/307 348/294 |
| 2012/0261551 A1* | 10/2012 | Rogers | G02B 3/14 250/208.1 |
| 2013/0181310 A1* | 7/2013 | Jun | H01L 27/14618 257/432 |
| 2015/0311259 A1* | 10/2015 | Joei | H01L 27/14636 250/208.1 |

FOREIGN PATENT DOCUMENTS

| | | |
|---|---|---|
| JP | 2008-258474 A | 10/2008 |
| JP | 2011-138927 A | 7/2011 |

* cited by examiner

SOLID-STATE IMAGE PICKUP DEVICE AND ELECTRONIC APPARATUS

BACKGROUND

The present disclosure relates to a solid-state image pickup device, a method of manufacturing the solid-state image pickup device, and an electronic apparatus, that use an organic photoelectric conversion material.

In a solid-state image pickup device such as a CCD (Charge Coupled Device) image sensor and a CMOS (Complementary Metal Oxide Semiconductor) image sensor, components such as a photodiode, a capacitor, and a floating diffusion are formed in a crystalline silicon substrate. For an electronic device such as a capacitor and a transistor, a technique of providing flexibility by using an organic semiconductor has been proposed (see, for example, Japanese Unexamined Patent Application Publication No. 2006-90983). For a photodiode using an inorganic semiconductor, a solid-state image pickup device that has flexibility by undergoing ultra-thinning processing has been proposed in Japanese Unexamined Patent Application Publication No. 2004-63776.

Further, in recent years, a solid-state image pickup device using an organic semiconductor (an organic photoelectric conversion material) for a photoelectric conversion layer has been also developed (see, for example, Japanese Unexamined Patent Application Publication Nos. 2008-258474 and 2011-138927).

SUMMARY

For a solid-state image pickup device using an organic photoelectric conversion material, a device, that allows simplification of optical design (or an image correction processing section or the like) used to perform optical correction such as shading correction, for example, has been expected to be achieved.

It is desirable to provide a solid-state image pickup device, a method of manufacturing a solid-state image pickup device, and an electronic apparatus, in each of which optical design is allowed to be simplified.

According to an embodiment of the present disclosure, there is provided an image sensor with a plurality of photoelectric conversion elements included in a laminated body. At least one of the photoelectric conversion elements includes organic photoelectric conversion elements. The laminated body includes first and second surfaces that are opposite one another. At least the first surface of the laminated body includes a curved light incident surface. The curved light incident surface incorporates a concave surface. The plurality of photoelectric conversion elements receive light through the concave light incident surface of the laminated body.

In accordance with further embodiments, the organic photoelectric conversion elements include a first electrode, an organic photoelectric conversion film, and a second electrode. The first electrode and the organic photoelectric conversion film, and the second electrode, are flexible. The substrate may also be flexible.

In accordance with at least some embodiments of the present disclosure, all of the photoelectric conversion elements are organic photoelectric conversion elements. In accordance with still other embodiments, the image sensor includes a plurality of pixels, wherein each of the pixels includes at least one organic photoelectric conversion element.

Embodiments of the present disclosure can also include a plurality of color filters, and at least one of the photoelectric conversion elements in each of the pixels can be associated with a color filter. In accordance with still other embodiments, for each pixel, the photoelectric conversion elements are sensitive to light in a different set of wavelengths. In accordance with further embodiments, each pixel can include layered photoelectric conversion elements. In accordance with further embodiments, the pixels of the image sensor can include at least one organic photoelectric conversion element and at least one photodiode. At least one of the organic photoelectric conversion elements is sensitive to green light, a first photodiode can receive light that is passed through the organic photoelectric conversion element and is sensitive to blue light, and a second photodiode can receive light that is passed through the organic photoelectric conversion element and the first photodiode and is sensitive to red light.

In accordance with still other embodiments, the image sensor can include a supporting member. The supporting member can include a concave section and a top surface. The laminated body can be joined to the top surface of the support structure. In addition, the image sensor can include an actuator disposed between the laminated body and a portion of the supporting member.

In accordance with further embodiments of the present disclosure, an electronic apparatus is provided. The apparatus includes an optical system, and a solid-state image sensor that receives light from the optical system. The solid-state image sensor includes a concave light incident surface and a plurality of pixels. Each of the pixels includes at least one organic photoelectric conversion element. The apparatus further includes a shutter unit that controls an irradiation of the solid-state image sensor with light from the optical system. A drive section is provided that controls operation of the shutter unit and transfer operations of the solid-state image sensor. In addition, the apparatus includes a signal processing section that performs signal processing operations on signals outputted from the solid-state image sensor.

In accordance with further embodiments, the electronic apparatus can include photoelectric conversion elements that are all organic photoelectric conversion elements. Moreover, the solid-state image sensor included in the apparatus can be flexible. In accordance with still other embodiments, each of the pixels includes at least one photodiode in addition to the at least one organic photoelectric conversion element.

In accordance with still other embodiments, a method of manufacturing an image sensor having a curved light incident surface and pixels that each include at least one organic photoelectric conversion element are provided. The method includes providing a supporting member. The method further includes forming a laminated body. As part of forming a laminated body, a substrate is provided, and a plurality of first electrodes are formed on the substrate. Each of the first electrodes are separated from one another by an inter-pixel insulating film. An organic photoelectric conversion layer on the first electrodes and the inter-pixel insulating film is formed. In addition, a second electrode on the organic photoelectric conversion layer is formed. A curved shape is then formed in the laminated body, wherein forming the curved shape includes joining the laminated body to the supporting member, and softening the laminated body.

In accordance with some embodiments, the laminated body is formed on the supporting member. The supporting member can include a top surface in a concave section, and forming a curved shape in a laminated body can include joining the laminated body to the support member such that the laminated body is placed on the top surface of the supporting member, to form a chamber between the concave section of the supporting member and a portion of laminated body. Forming a curved shape in the laminated body can further include withdrawing air from the chamber. Forming a curved shape in the laminated body can also include adjusting a pressure of the chamber between the concave section of the supporting member and a portion of the laminated body. In accordance with yet another embodiment, forming a curved shape in the laminated body can include inserting a press member through a hole in the supporting member, wherein the curved shape is formed by pressing the press member against the laminated body. The substrate can include a magnetic material, and forming a curved shape in a laminated body can further include applying a magnetic field to create the curved shape in the laminated body. In accordance with still other embodiments, the supporting member includes a convex section, and forming a curved shape in the laminated body includes joining the laminated body to the support member such that the laminated body is placed on the convex section of the supporting member.

Additional features and advantages of embodiments of the present disclosure will become more readily apparent from the following description, particularly when taken together with the accompanying drawings.

It is to be understood that both the foregoing general description and the following detailed description are exemplary, and are intended to provide further explanation of the present technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to describe the principles of the present technology.

DETAILED DESCRIPTION

Some embodiments of the present disclosure will be described below in detail with reference to the drawings. It is to be noted that the description will be provided in the following order.

1. First Embodiment (an example of a solid-state image pickup device in which a surface S1 on a light incident side of a laminated body including an organic photoelectric conversion layer is a concave curved surface)

2. Modification 1 (an example of a case in which a laminated body is formed on a supporting member by transfer)

3. Modification 2 (an example of a case in which a curve shape is formed in a laminated body by using a supporting member having an opening)
4. Modification 3 (an example of a case in which a curve shape is formed in a laminated body by application of a magnetic field)
5. Modification 4 (an example of a case in which pressure is applied to a concave section of a supporting member)
6. Modification 5 (an example of a case in which a laminated body is formed on a substrate, from a second electrode)
7. Second Embodiment (an example of a solid-state image pickup device in which an organic photoelectric conversion layer and an inorganic photoelectric conversion layer are provided along a thickness direction of a substrate)
8. Overall Configuration Example of Solid-state Image Pickup Device
9. Application Example (an example of an electronic apparatus (a camera))

First Embodiment

[Configuration]

Figure 1:
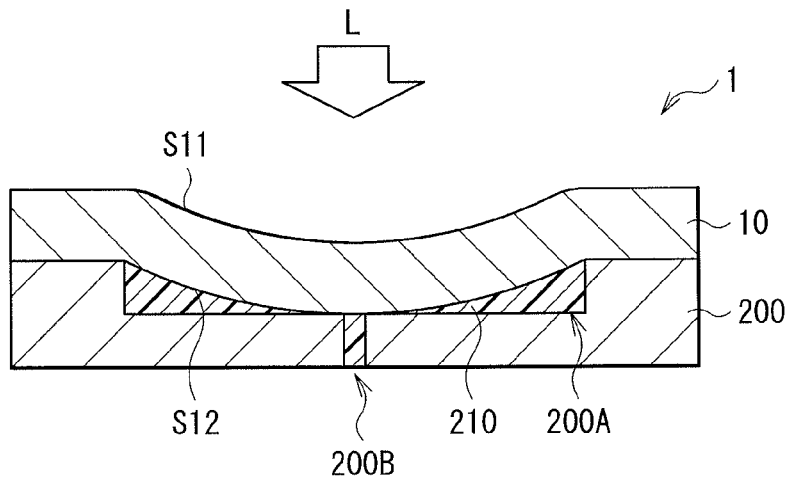
FIG. 1 is a cross-sectional diagram illustrating a schematic configuration of a solid-state image pickup device according to a first embodiment of the present disclosure.

FIG. 1 illustrates a schematic cross-sectional configuration of a solid-state image pickup device (a solid-state image pickup device 1) according to a first embodiment of the present disclosure. For example, the solid-state image pickup device 1 may be a CCD or CMOS image sensor, and may include a plurality of pixels arranged two-dimensionally. The solid-state image pickup device 1 includes a laminated body 10 containing an organic photoelectric conversion material. The laminated body 10 has two surfaces (surfaces S11 and S12) facing each other. The surface S1, of the two surfaces, on the light incident side may be, for example, a concave curved surface. In other words, the laminated body 10 has a curve shape including the concave curved surface at the surface S11. The curve shape of the laminated body 10 may be held by, for example, a supporting member 200. Space between the supporting member 200 and the laminated body 10 may be, for example, filled with a bonding layer 210.

Figure 2:
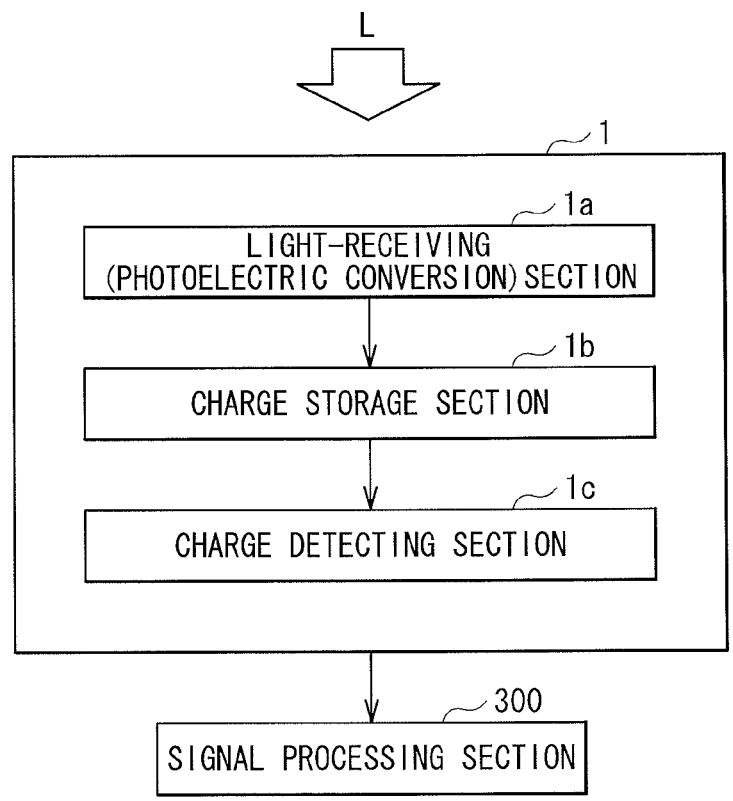
FIG. 2 is a functional block diagram of the solid-state image pickup device illustrated in FIG. 1.

FIG. 2 illustrates an outline of a functional configuration of the solid-state image pickup device 1. As illustrated in this drawing, the solid-state image pickup device 1 may include, for example, a light-receiving section (a photoelectric conversion section) 1a, a charge storage section 1b, and a charge detecting section 1c. Electric charge detected in the solid-state image pickup device 1 may be outputted to, for example, a signal processing section 300 (or a data storage section) or the like. The photoelectric conversion section 1a may have, for example, a photodiode structure, and the charge storage section 1b may have, for example, a capacitor structure. The charge detecting section 1c may have, for example, a floating diffusion amplifier structure. In the solid-state image pickup device 1 of the present embodiment, the laminated body 10 corresponding to the photoelectric conversion section 1a (a photodiode part) among these sections has the above-described curved shape, and has flexibility at least in a manufacturing process. After being manufactured, the laminated body 10 may be used in a deformable manner with flexibility (for example, as an actuator described later), or may be used while the curved shape is kept fixed (a curvature of the concave curved surface is kept constant), depending on application thereof. Further, the concave curved surface of the surface S11 may be spherical, or may be aspherical. Furthermore, the curved shape of the laminated body 10 may be a shape having a curvature along only one axis direction (semicylindrical shape), or may be a shape having a curvature along two axis direction (semispherical shape).

[Laminated Body 10]

Figure 3:
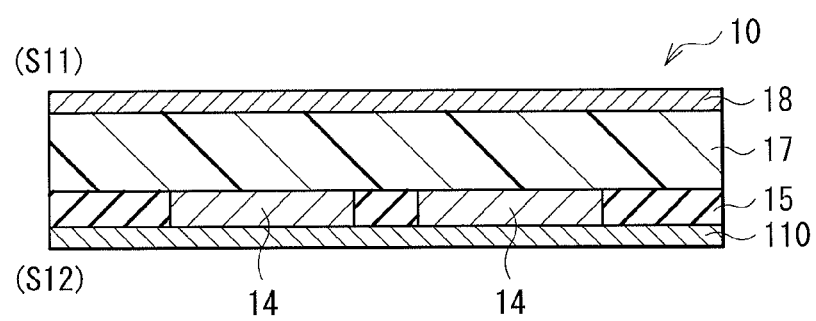
FIG. 3 is a cross-sectional diagram illustrating a configuration of a laminated body illustrated in FIG. 1.

FIG. 3 illustrates a cross-sectional configuration of the laminated body 10. The laminated body 10 may include, for example, a first electrode 14, an organic photoelectric conversion layer 17, and a second electrode 18 in order on a substrate 110. The first electrode 14 may be, for example, a pixel electrode provided for each of the pixels, and may be, for example, electrically separated for each of the pixels by an inter-pixel insulating film 15. The second electrode 18 may be provided, for example, as an electrode common to the respective pixels. It is to be noted that, in FIG. 3, only two of the first electrodes 14 are illustrated for convenience. Further, a protective film, a planarizing film, a color filter, an on-chip lens, etc. which are not illustrated may be provided on the second electrode 18 as necessary.

The substrate 110 may be made of, for example, a material having flexibility or plasticity, and is deformable at least in a manufacturing process. Examples of the plasticity may include a property of being deformable by heating (thermoplasticity) and a property of being deformable by optical irradiation (photoplasticity). Examples of the material having thermoplasticity may include plastic materials such as polyethylene terephthalate (PET), polyethylene naphthalate (PEN), polystyrene (PS), acrylic resin, and polymethyl methacrylate resin (PMMA). Examples of the material having flexibility may include a material having a property of being deformable by application of external force or the like, even when the material is not placed under the above-described condition such as heating and optical irradiation. Examples of such a material may include, in addition to the above-described plastic materials, thin-film glass made of so-called Gorilla Glass, and transparent oxides. In addition thereto, a metallic thin film, a magnetic material, or the like other than the above-described materials may be used. The material and thickness of the substrate 110 may be preferably those allowing the curve shape to be maintained, but may be set depending on application. It is to be noted that, in the present embodiment, a case in which a thermoplastic resin is used as an example of the material of the substrate 110 will be described as an example.

The first electrode 14 and the second electrode 18 each have flexibility and electric conductivity. Of the first electrode 14 and the second electrode 18, the electrode (in this example, the second electrode 18) on the light incident side further has optical transparency. Examples of a material having flexibility, conductivity, and optical transparency may include nano-carbon (such as carbon nanotube and graphene) and electroconductive polymer (PEDOT/PSS). Alternatively, a metal mesh electrode may also be used. Still alternatively, a transparent conductive film, which is made of ITO (Indium Tin Oxide) or the like and formed to be thin to the extent that flexibility is achievable, may be used. Further, examples of a material having at least flexibility and electric conductivity may include electrically-conductive composite materials (specifically, an electrically-conductive binding material, an electrically-conductive rubber, and the like). Alternatively, a metallic material formed to be thin to the extent that flexibility is achievable may be used. In this example, since the second electrode 18 is provided on the surface S11 side upon which light is incident, and the substrate 110 is provided on the surface S12 side, optical transparency may be provided only in the second electrode 18.

Through one electrode of the first electrode 14 and the second electrode 18, an electron (or a positive hole) of an electric charge generated in the organic photoelectric conversion layer 17 is extracted. The positive hole (or the electron) is extracted through the other electrode. Here, the electric charge extracted through the first electrode 14 is accumulated in the charge storage section 1*b* as a signal charge, and the electric charge extracted through the second electrode 18 is discharged to the outside.

The organic photoelectric conversion layer 17 may be, for example, a layer that absorbs a selective wavelength or all wavelengths, and generates an electron-hole pair. Examples of an organic semiconductor used to form the organic photoelectric conversion layer 17 may include a p-type or n-type organic semiconductor as described below. As such an organic semiconductor, any one of quinacridone derivatives, diketo-pyrrolo-pyrrole derivatives, naphthalene derivatives, anthracene derivatives, phenanthrene derivatives, tetracene derivatives, pyrene derivatives, perylene derivatives, and fluoranthene derivatives may be suitably used. Alternatively, any of polymers of phenylene vinylene, fluorene, carbazole, indole, pyrene, pyrrole, picoline, thiophene, acetylene, diacetylene, and the like, as well as derivatives thereof may be used. In addition, it may be possible to preferably use metal complex dyes, rhodamine-based dyes, cyanine-based dyes, merocyanine-based dyes, indigo-based dyes, thioindigo-based dyes, phthalocyanine-based dyes, subphthalocyanine-based dyes, dipyrine-based dyes, phenylxanthene-based dyes, triphenylmethane-based dyes, rhodacyanine-based dyes, xanthene-based dyes, macrocyclic azaannulene-based dyes, azulene-based dyes, naphthoquinone-based dyes, and anthraquinone-based dyes. Also, it may be possible to preferably use: condensed polycyclic aromatic compounds such as anthracene and pyrene; chain compounds obtained by condensation between aromatic ring and hetero ring compounds; nitrogen-containing heterocyclic rings such as quinoline, benzothiazole, and benzoxazole, bonded through a squarylium group and a croconic methine group, and cyanine analogue dyes bonded by a squarylium group and a croconic methine group. It is to be noted that, as the above-described metal complex dyes, dithiol metal complex dyes, metallophthalocyanine dyes, metalloporphyrin dyes, or ruthenium complex dyes may be preferable, but the metal complex dyes are not limited thereto. The organic photoelectric conversion layer 17 includes one or more kinds of the above-enumerated materials.

Figure 4A:
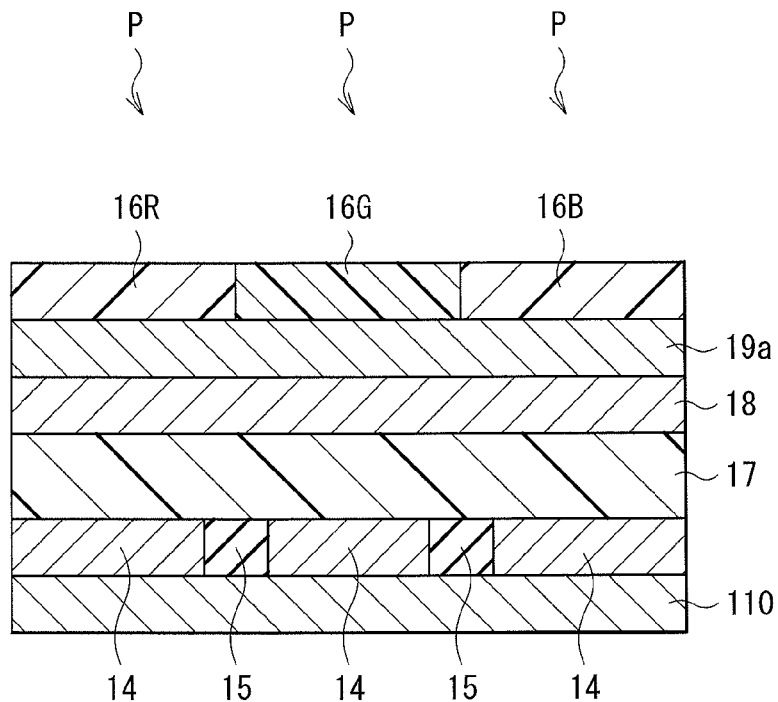
FIG. 4A is a cross-sectional diagram illustrating a detailed configuration example of the laminated body illustrated in FIG. 1.

The organic photoelectric conversion layer 17 may be, for example, a layer that absorbs all wavelengths (white light) or a layer that absorbs a selective wavelength. Specifically, when the organic photoelectric conversion layer 17 absorbs all wavelengths, a color filter of any of R (red), G (green), and B (blue) (any of a red filter 16R, a green filter 16G, and a blue filter 16B) may be disposed for each pixel P as illustrated in, for example, FIG. 4A. It is to be noted that, for example, an intermediate layer 19*a* including a protective layer and the like may be formed between the second electrode 18 and each of the red filter 16R, the green filter 16G, and the blue filter 16B. This allows a photoelectric conversion signal of any of R, G, and B to be obtained for each pixel.

Figure 4B:
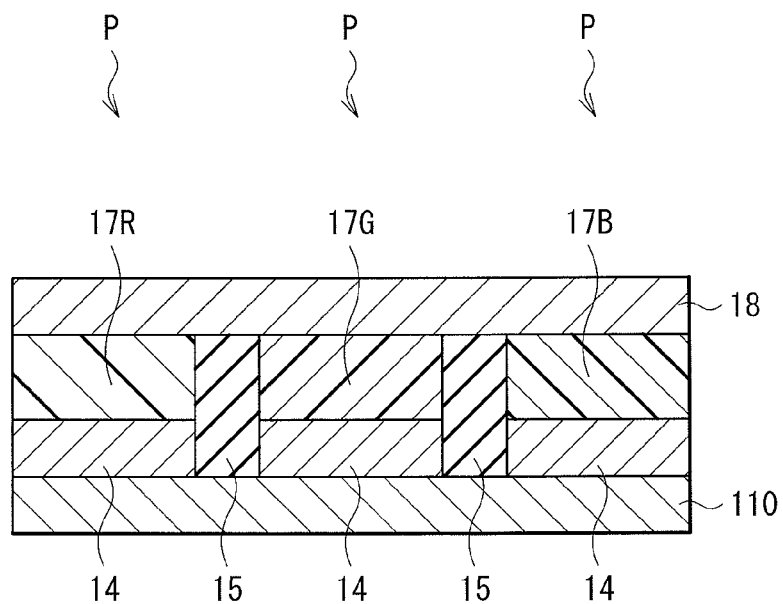
FIG. 4B is a cross-sectional diagram illustrating another detailed configuration example of the laminated body illustrated in FIG. 1.

Alternatively, as illustrated in FIG. 4B, an organic photoelectric conversion layer that photoelectrically converts a wavelength of any of R, G, and B (any of a red photoelectric conversion layer 17R, a green photoelectric conversion layer 17G, and a blue photoelectric conversion layer 17B) for every pixel may be provided. In this case, the red photoelectric conversion layer 17R, the green photoelectric conversion layer 17G, and the blue photoelectric conversion layer 17B are electrically separated from one other by the inter-pixel insulating film 15.

Figure 4C:
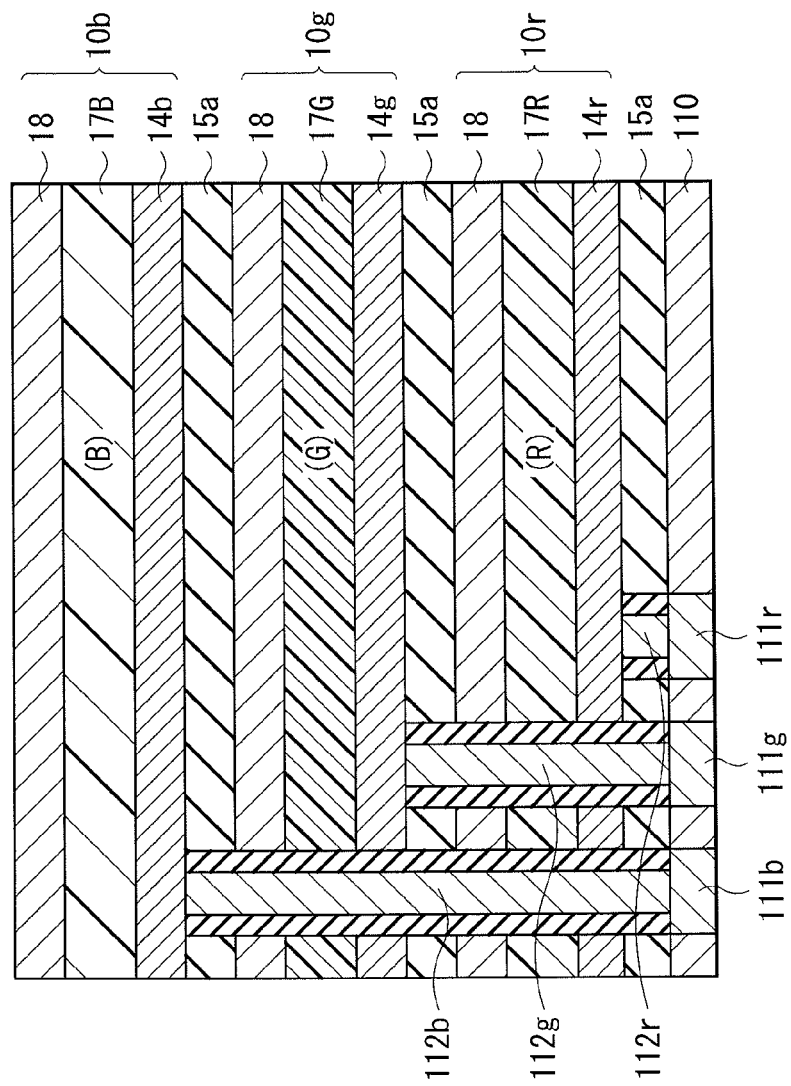
FIG. 4C is a cross-sectional diagram illustrating still another detailed configuration example of the laminated body illustrated in FIG. 1.

Still alternatively, as illustrated in FIG. 4C, there may be provided a structure in which the red photoelectric conversion layer 17R, the green photoelectric conversion layer 17G, and the blue photoelectric conversion layer 17B are laminated in a vertical direction (a thickness direction) within one pixel. In this case, for example, an element section 10*r* (a first electrode (R) 14*r*, the red photoelectric conversion layer 17R, and the second electrode 18) provided to obtain a photoelectric conversion signal of red may be formed on the substrate 110 with an interlayer insulating film 15*a* interposed therebetween. On the element section 10*r*, an element section 10*g* (a first electrode (G) 14*g*, the green photoelectric conversion layer 17G, and the second electrode 18) provided to obtain a photoelectric conversion signal of green may be formed with the interlayer insulating film 15*a* interposed therebetween. Further, on the element section 10*g*, an element section 10*b* (a first electrode (B) 14*b*, the blue photoelectric conversion layer 17B, and the second electrode 18) provided to obtain a photoelectric conversion signal of blue may be formed with the interlayer insulating film 15*a* interposed therebetween. For example, the photoelectric conversion signal generated in the element section 10*r* may be extracted from the first electrode (R) 14*r*, and may be sent to a pixel transistor (not illustrated) through a contact plug 112*r* connected to the first electrode (R) 14*r* and through a wiring layer 111*r*. Similarly, for example, the photoelectric conversion signal generated in the element section 10*g* may be extracted from the first electrode (G) 14*g*, and may be sent to a pixel transistor (not illustrated) through a contact plug 112*g* connected to the first electrode (G) 14*g* and through a wiring layer 111*g*. Further, for example, the photoelectric conversion signal generated in the element section 10*b* may be extracted from the first electrode (B) 14*b*, and may be sent to a pixel transistor (not illustrated) through a contact plug 112*b* connected to the first electrode (B) 14*b* and through a wiring layer 111*b*.

However, the organic photoelectric conversion layer 17 may include, for example, a photoelectric conversion layer of other color such as orange, yellow, and purple, without being limited to the above-described three colors of R, G, and B. In addition, as will be described later in detail, there may be provided a vertical spectrum structure in which the organic photoelectric conversion layer 17 absorbs a specific wavelength (for example, green light), and a photoelectric conversion layer (a photodiode) made of an inorganic semiconductor is formed in the substrate 110 to absorb other wavelengths (e.g. red light and blue light).

It is to be noted that, between the organic photoelectric conversion layer 17 and the first electrode 14, and between the organic photoelectric conversion layer 17 and the second electrode 18, other layer (not illustrated) may be provided. For example, an undercoating film, an electron blocking film, the organic photoelectric conversion layer 17, a hole blocking film, a buffer film, a work-function adjustment film, and the like may be laminated in order from the first electrode 14, as necessary. Thus using an organic photoelectric conversion material for the laminated body 10 makes it possible to achieve favorable color separativeness and to enhance bendability, as compared with a case of using an inorganic semiconductor.

[Supporting Member 200]

The supporting member 200 is a member that maintains the curve shape of the laminated body 10 and is utilized in forming the curve shape of the laminated body 10 in the course of manufacturing. In the present embodiment, the supporting member 200 has a concave section 200A facing the laminated body 10, and the concave section 200A is provided with an air vent 200B. The air vent 200B serves as an air outlet for pressure regulation of the concave section 200A in the course of manufacturing (a curve-shape forming process that will be described later), in the present embodiment. The concave section 200A and the air vent 200B are filled with the bonding layer 210. However, when maintaining the shape in the laminated body 10 is sufficient (or unnecessary), the bonding layer may not necessarily be formed. Also, the supporting member 200 may not necessarily be provided either (the supporting member 200 is used in the course of manufacturing, but may be peeled off from the laminated body 10 eventually.)

The solid-state image pickup device 1 as described above may be manufactured as follows, for example.

[Manufacturing Method]

FIG. 5A to FIG. 7 illustrate a manufacturing process of the solid-state image pickup device 1 in the present embodiment. FIG. 5A to FIG. 5D correspond to a laminated-body forming process. FIG. 6A and FIG. 6B correspond to the curve-shape forming process (a concave-curved-surface forming process).

Figure 5A:
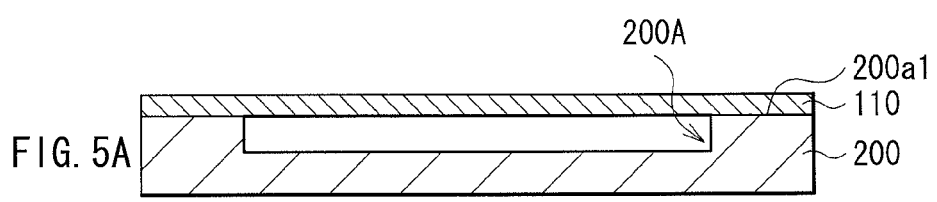
FIGS. 5A to 5D are cross-sectional diagrams used to describe a method of manufacturing the solid-state image pickup device (a process of forming the laminated body) illustrated in FIG. 1.
Figure 5B:
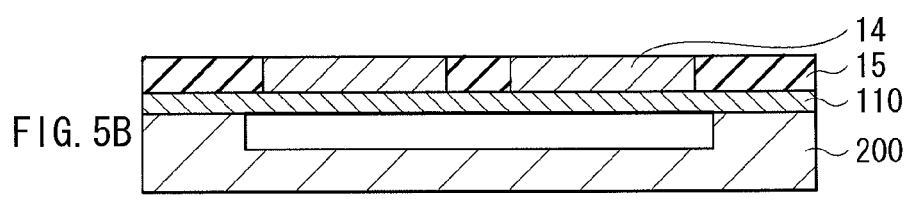
Figure 5C:
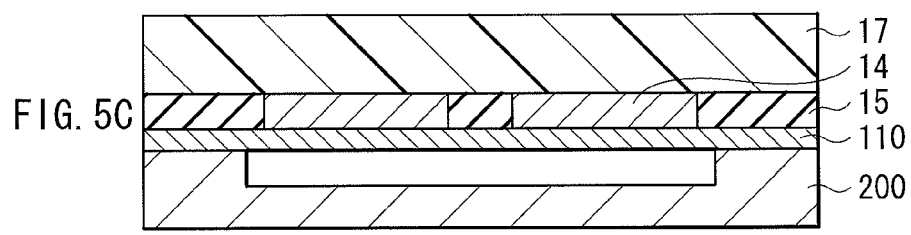
Figure 5D:
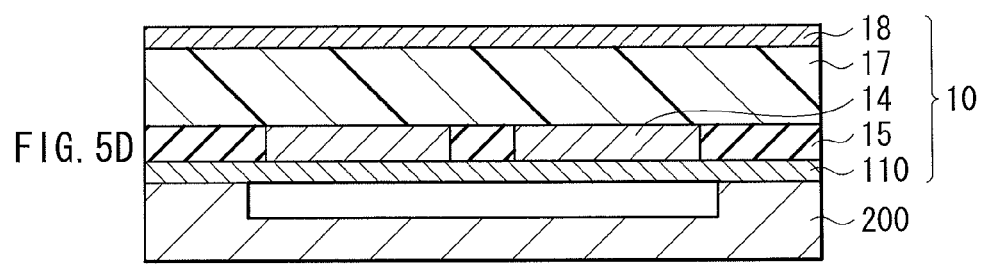

First, the laminated body 10 is formed on the supporting member 200. In this formation, first, the substrate 110 made of the above-described material and the like is adhered onto the supporting member 200 to face the concave section 200A, as illustrated in FIG. 5A. Specifically, an end part (a peripheral part) of the laminated body 10 is adhered onto a surface 200a1, on which the concave section 200A is not formed, of the top surface of the supporting member 200. Next, as illustrated in FIG. 5B, the first electrode 14 made of the above-described material and a wiring layer (not illustrated) are formed on the substrate 110 to have a pattern, by using, for example, vacuum deposition, sputtering, photolithography, or the like. Subsequently, the respective first electrodes 14 are electrically separated from one another with the use of the inter-pixel insulating film 15. Next, as illustrated in FIG. 5C, the organic photoelectric conversion layer 17 is formed by, for example, vacuum deposition using a shadow mask. Specifically, the substrate 110 is placed in a chamber of a vapor deposition unit, in a state of being disposed on the supporting member 200. Subsequently, air is exhausted from the chamber to achieve a predetermined vacuum state, and the organic photoelectric conversion material described above is deposited (co-deposited) on the first electrode 14 by, for example, vacuum deposition. Thereafter, as illustrated in FIG. 5D, the second electrode 18 made of the above-described material is formed by, for example, vacuum deposition, sputtering, or the like. It is to be noted that the supporting member 200 and the substrate 110 may be adhered to each other as described above, or may be temporarily adhered (fixed) to be peeled off from each other after the formation of the curve shape.

Figure 6A:
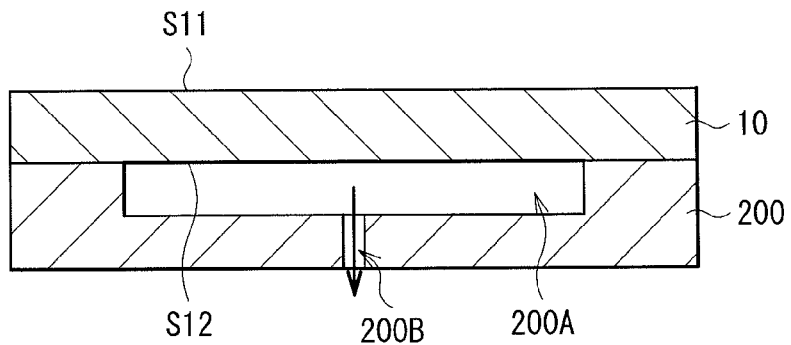
FIGS. 6A and 6B are cross-sectional diagrams illustrating a process (a curve-shape forming process) following that in FIGS. 5A to 5D.
Figure 6B:
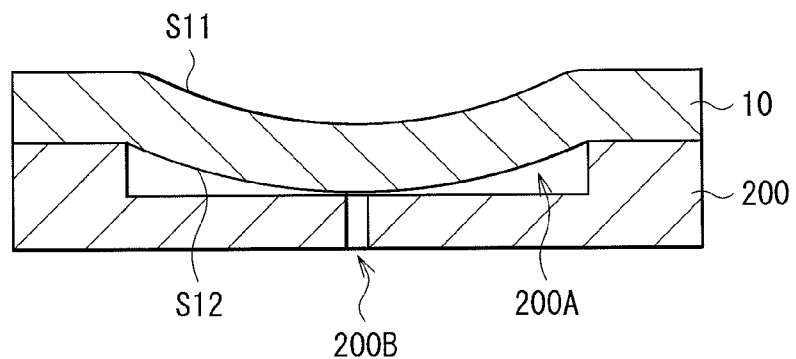

Next, the curve shape is formed in the laminated body 10 (the laminated body 10 is curved). Specifically, at first, as illustrated in FIG. 6A, inside of the concave section 200A is decompressed by exhausting air from the concave section 200A with the use of the air vent 200B of the supporting member 200. In this stage, preferably, a thermoplastic material may be used for the substrate 110, and the substrate 110 may be softened by performing an annealing treatment before exhausting the air. As a result, as illustrated in FIG. 6B, the laminated body 10 is drawn into the concave section 200A of the supporting member 200, and the curve shape in which the surface S11 is the concave curved surface is formed in the laminated body 10. After the laminated body 10 is bent to have a desirable curvature, the substrate 110 is cooled (cooled down to ambient temperature) to be cured. The curvature of the curve shape is controllable by pressure regulation (adjustment of the amount of exhaust air) using the air vent 200B. It is to be noted that when a thermoplastic material is used for the substrate 110 and minute control of the curvature is not necessary in particular, providing the air vent 200B in the supporting member 200 may be omitted. This is because the substrate 110 made soft by the annealing treatment forms a curve by sinking in the concave section 200A by itself.

Figure 7:
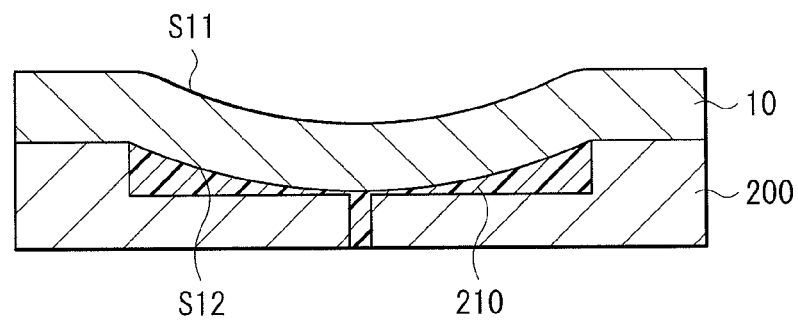
FIG. 7 is a cross-sectional diagram illustrating a process following the process in FIGS. 6A and 6B.

Next, as illustrated in FIG. 7, a bonding material is injected into the concave section 200A through the air vent 200B, to form the bonding layer 210. This allows the laminated body 10 to adhere to the supporting member 200 and to increase the retention of the curve shape of the laminated body 10. The solid-state image pickup device 1 illustrated in FIG. 1 is thus completed.

It is to be noted that, depending on application, the supporting member 200 may be peeled off from the laminated body 10, after the curve shape of the laminated body 10 is formed (in other words, adhesion of the supporting member 200 to the laminated body 10 may not be performed).

In the present embodiment, as described above, in the laminated body 10, the substrate 110 has flexibility or thermoplasticity, and the first electrode 14 and the second electrode 18 have flexibility. Therefore, it is possible to form the concave curved surface at the surface S11 on the light incident side of the laminated body 10, in the manufacturing process. Accordingly, for example, it may be possible to ease nonuniformity of the amount of light received in each of pixels disposed in a central part of the laminated body 10 and pixels disposed in a peripheral part thereof, and to thereby reduce unevenness in amount of light. Therefore, for example, optical correction effects such as so-called sensitivity shading correction and curvature-of-field correction may be obtained, while, for example, simplification of optical design in an on-chip lens or the like (or an image correction processing section or the like) may be allowed. Accordingly, optical design is allowed to be simplified.

In addition, three-dimensional information is allowed to be obtained by single shooting (from an image for one frame), by providing the concave curved surface at the surface S11 of the laminated body 10 as in the present embodiment. Therefore, a solid-state image pickup device suitably mounted on an electronic apparatus such as a lightweight small camera is achievable.

Next, modifications (Modifications 1 to 5) of the above-described first embodiment will be described. It is to be noted that, in the following, the same elements as those of the first embodiment will be provided with the same reference numerals as those of the first embodiment, and the description thereof will be omitted as appropriate.

Modification 1

FIG. 8A to FIG. 9D illustrate a laminated-body forming process according to Modification 1, in order of step. In the first embodiment, the laminated body 10 is directly formed on the supporting member 200. As in Modification 1, however, the laminated body 10 may be transferred onto the supporting member 200, after being formed on a supporting plate (a temporary supporting plate 201).

Figure 8A:
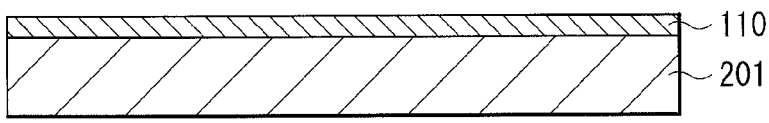
FIGS. 8A to 8D are cross-sectional diagrams used to describe a process of forming a laminated body according to Modification 1.

Specifically, first, as illustrated in FIG. 8A, the substrate 110 is adhered onto the temporary supporting plate 201.

Figure 8B:
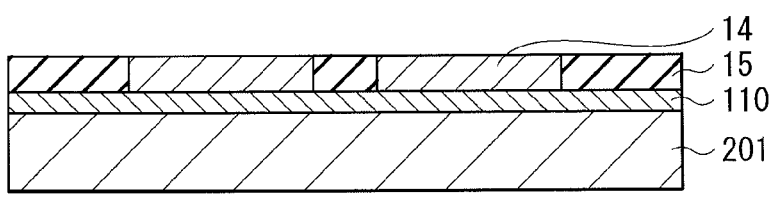
Figure 8C:
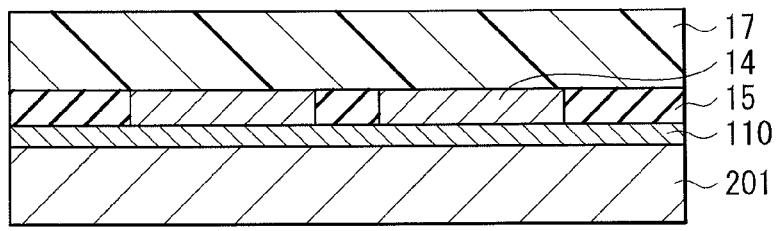
Figure 8D:
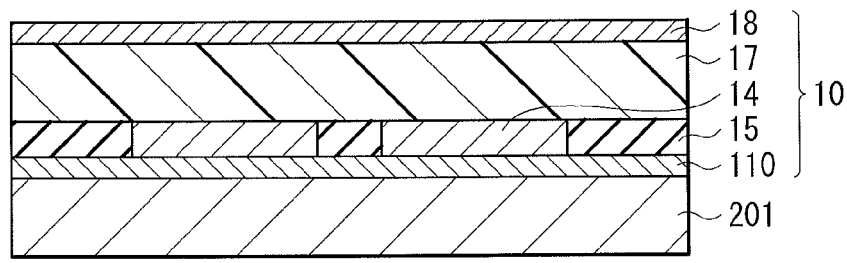

Next, as illustrated in FIG. 8B, the first electrode 14 and the inter-pixel insulating film 15 are formed on the substrate 110, in a manner similar to that in the first embodiment. Subsequently, as illustrated in FIG. 8C, the organic photoelectric conversion layer 17 is formed by, for example, vacuum deposition, in a manner similar to that in the first embodiment. Afterwards, as illustrated in FIG. 8D, the second electrode 18 is formed in a manner similar to that in the first embodiment. In this way, the laminated body 10 is formed on the temporary supporting plate 201.

Figure 9A:
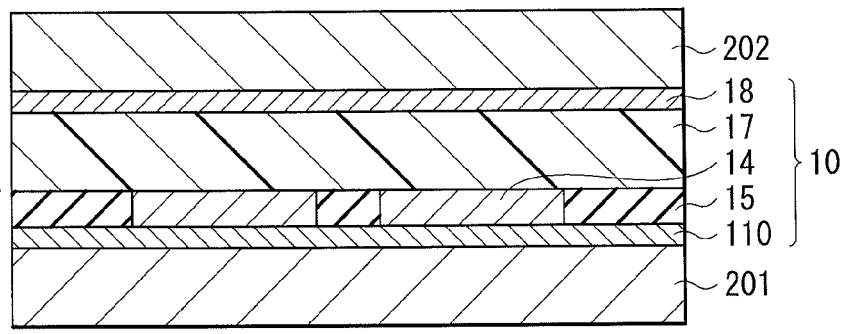
FIGS. 9A to 9D are cross-sectional diagrams illustrating a process following the process in FIGS. 8A to 8D.
Figure 9B:
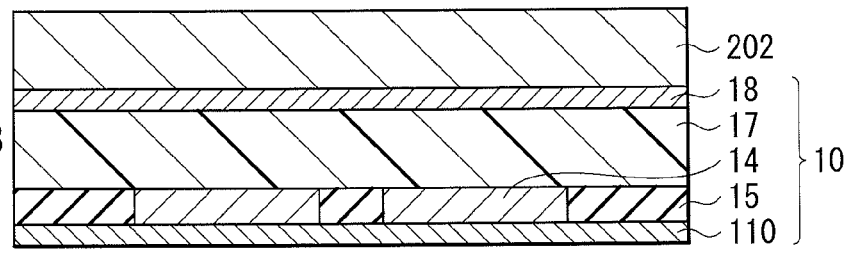
Figure 9C:
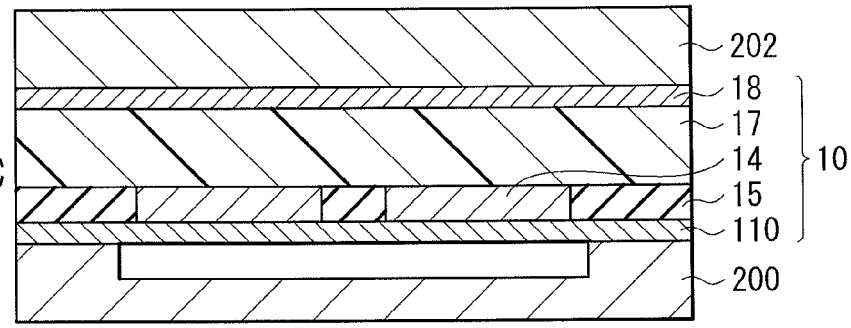
Figure 9D:
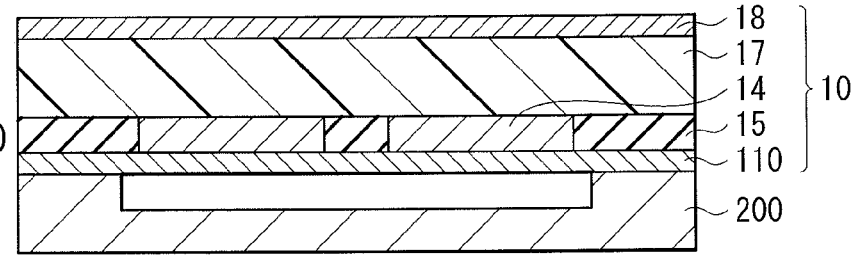

Next, a transfer layer 202 is formed on the second electrode 18, as illustrated in FIG. 9A. The temporary supporting plate 201 is then peeled off from the substrate 110, as illustrated in FIG. 9B. Subsequently, as illustrated in FIG. 9C, the supporting member 200 is adhered on a back-surface side of the substrate 110 (onto the surface S12 of the laminated body 10), so that the concave section 200A and the laminated body 10 face each other. Lastly, the laminated body 10 is formed on the supporting member 200, by peeling off the transfer layer 202 from the second electrode 18.

Afterwards, a predetermined curve shape is formed in the laminated body 10, through a curve-shape forming process similar to that in the above-described first embodiment.

Figure 10A:
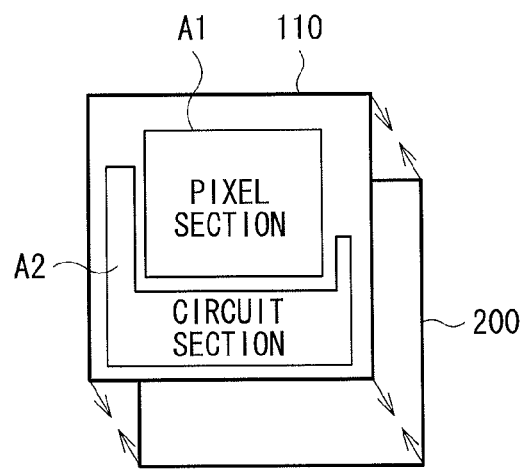
FIG. 10A is a schematic diagram used to describe an advantage of the process of forming the laminated body according to Modification 1.
Figure 10B:
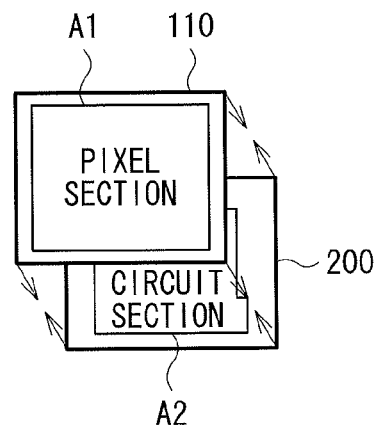
FIG. 10B is a schematic diagram used to describe the advantage of the process of forming the laminated body according to Modification 1.

The laminated body 10 may be formed on the supporting member 200 by the transfer as in Modification 1. In this case, the substrate 110 is less likely to be bent in the formation process of the laminated body 10 and thus, process precision is higher, and flexibility is also higher, as compared with those of the above-described first embodiment. Further, a material that does not have heat resistance may be used for the supporting member 200. Therefore, a circuit board on which a logical circuit and the like are formed may be used as the supporting member 200. As illustrated in FIG. 10A and FIG. 10B, as compared with a case in which a pixel section A1 and a circuit section A2 are laid out on the substrate 110, a case in which the pixel section A1 and the circuit section A2 are laid out on the substrate 110 and the supporting member 200, respectively, is advantageous in term of reduction in area. When the transfer layer 202 is made of a material having elasticity (e.g. PDMS (polydimethylsiloxane) or the like), a desirable curve shape is allowed to be formed without the curve-shape forming process described in the above-described first embodiment. In other words, by adjusting conditions such as pressure and temperature, the laminated body 10 is allowed to be transferred onto the supporting member 200 while being curved by the transfer layer 202.

Modification 2

Figure 11:
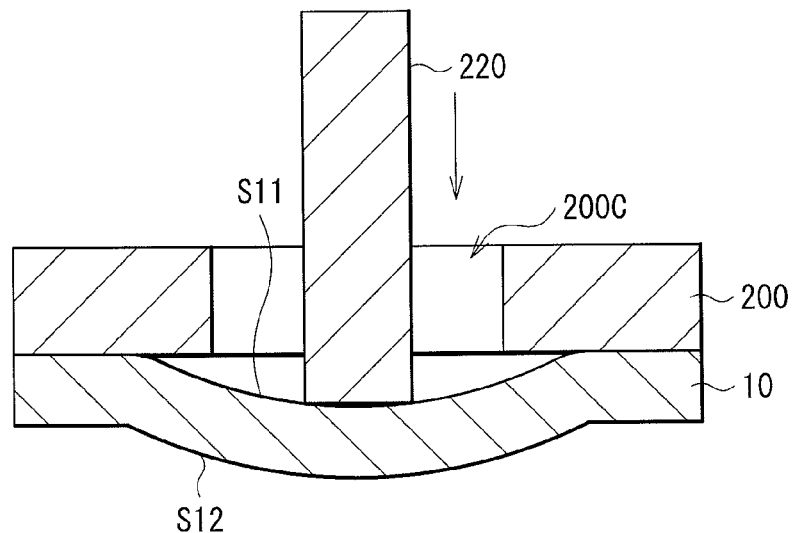
FIG. 11 is a cross-sectional diagram used to describe a curve-shape forming process according to Modification 2.

FIG. 11 illustrates a curve-shape forming process according to Modification 2. In the above-described first embodiment, the laminated body 10 is formed by the pressure regulation using the air vent 200B provided in the supporting member 200, but the technique of forming the curve shape is not limited thereto. For example, as in this Modification 2, a member having an opening 200C may be used as the supporting member 200. After formation of the laminated body 10 on the supporting member 200, a press member 220 shaped like a stick may be inserted into the opening 200C to push out the laminated body 10, and thereby, the laminated body 10 may be curved. It is to be noted that, in this case, preferably, a thermoplastic material may be used for the substrate 110 and the substrate 110 may be softened by an annealing treatment beforehand, as with the above-described first embodiment.

Modification 3

Figure 12:
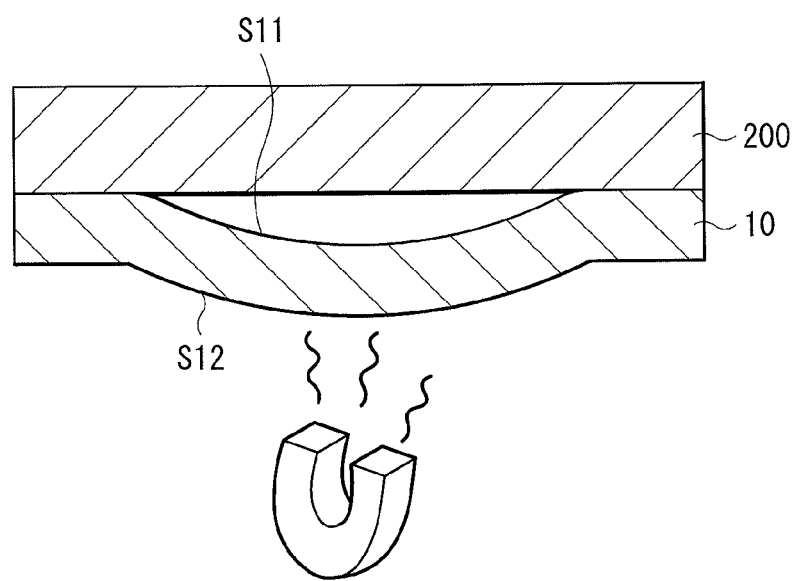
FIG. 12 is a cross-sectional diagram used to describe a curve-shape forming process according to Modification 3.

FIG. 12 illustrates a curve-shape forming process according to Modification 3. In the above-described first embodiment, the laminated body 10 is formed by the pressure regulation using the air vent 200B provided in the supporting member 200, but the technique of forming the curve shape is not limited thereto. For example, as in this Modification 3, a magnetic material (e.g. a metallic thin film or the like) may be used for the substrate 110, and after formation of the laminated body 10 on the supporting member 200, a magnetic field may be applied to form the curve shape. In this case, it is not necessary to form the concave section 200A and the air vent 200B in the supporting member 200.

Modification 4

Figure 13A:
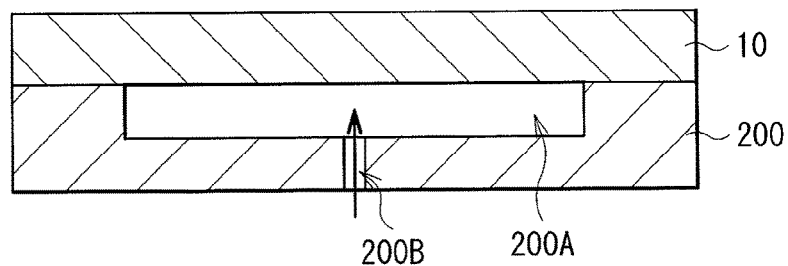
FIGS. 13A and 13B are cross-sectional diagrams used to describe curve-shape forming process according to Modification 4.
Figure 13B:
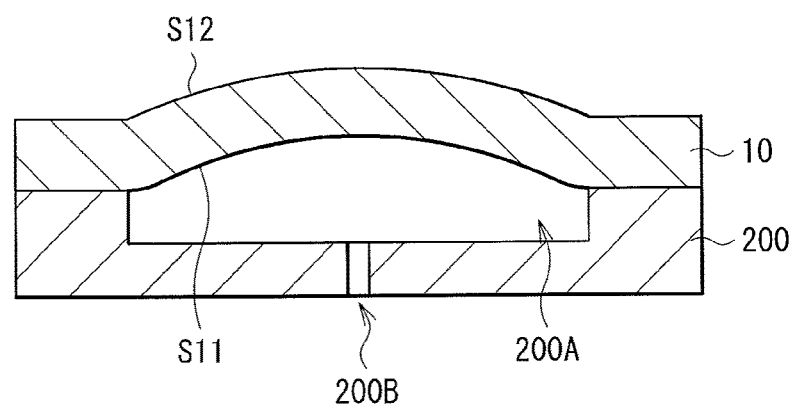
Figure 14:
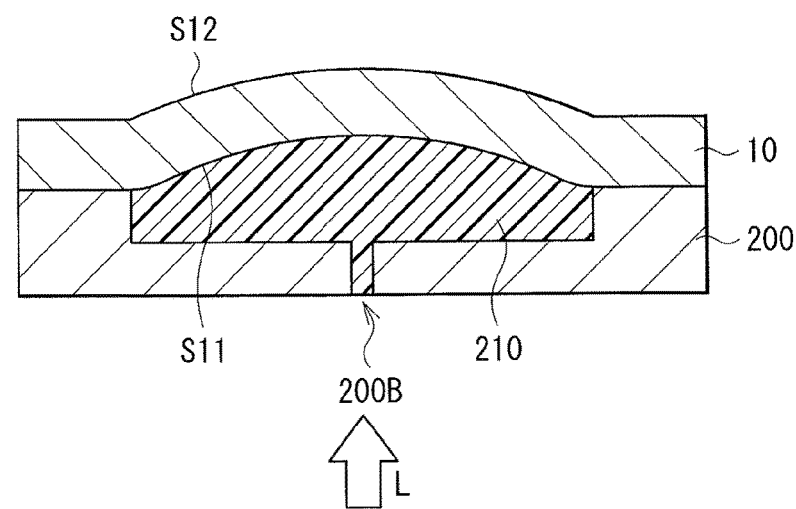
FIG. 14 is a cross-sectional diagram illustrating a process following the process in FIGS. 13A and 13B.

FIG. 13A to FIG. 14 illustrate a curve-shape forming process according to Modification 4. In the above-described first embodiment, the curve shape is formed in the laminated body 10 by decompressing the inside of the concave section 200A of the supporting member 200. However, conversely, the curve shape may be formed by applying pressure. Specifically, as illustrated in FIG. 13A, subsequent to formation of the laminated body 10 on the supporting member 200, air or the like is sent to the inside of the concave section 200A through the air vent 200B to increase pressure in the concave section 200A. It is to be noted that, also in this case, preferably, a thermoplastic material may be used for the substrate 110, and the substrate 110 may be softened by an annealing treatment beforehand, as with the above-described first embodiment. This allows to form the curve shape having the concave curved surface (the surface S11) as illustrated in FIG. 13B. Afterwards, as illustrated in FIG. 14, the concave section 200A and the air vent 200B are filled with the bonding layer 210, in a manner similar to that in the above-described first embodiment.

Modification 5

FIG. 15A to FIG. 17 illustrate a method of manufacturing a solid-state image pickup device according to Modification 5, in process order. Of these, FIG. 15A to FIG. 16 correspond to a laminated-body forming process, and FIG. 17 corresponds to a curve-shape forming process. In the above-described first embodiment, the laminated body 10 is formed by laminating the first electrode 14, the organic photoelectric conversion layer 17, and the second electrode 18 in order on the substrate 110. However, as in this Modification 5, the laminated body 10 may be formed in reverse order.

Figure 15A:
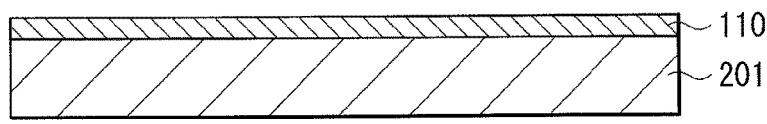
FIGS. 15A to 15D are cross-sectional diagrams used to describe a method of manufacturing a solid-state image pickup device (a process of forming a laminated body) according to Modification 5.
Figure 15B:
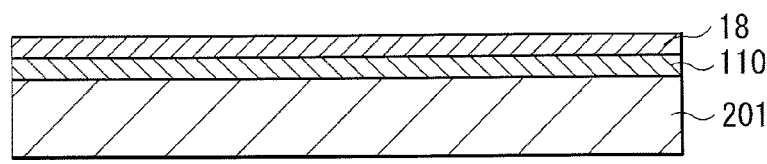
Figure 15C:
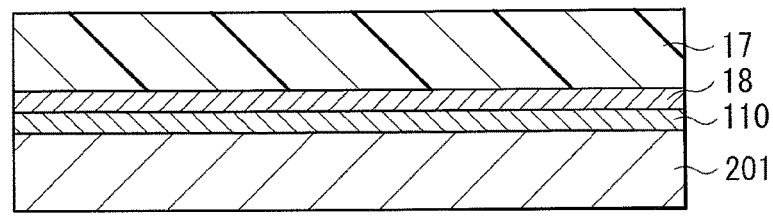
Figure 15D:
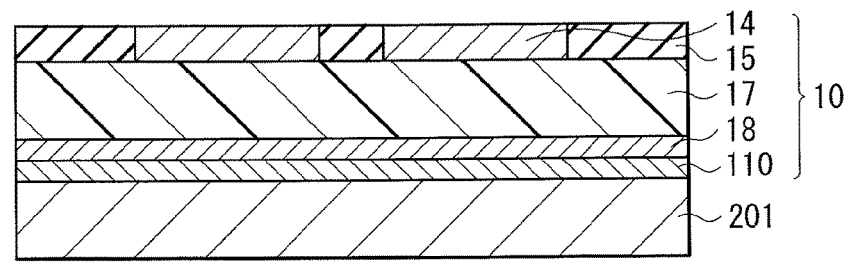

Specifically, at first, the substrate 110 is adhered onto the temporary supporting plate 201, as illustrated in FIG. 15A. Subsequently, as illustrated in FIG. 15B, the second electrode 18 is formed on the substrate 110 by a technique similar to that in the above-described first embodiment. Next, as illustrated in FIG. 15C, the organic photoelectric conversion layer 17 may be formed by vacuum deposition, for example, through use of a technique similar to that in the above-described first embodiment. Afterwards, as illustrated in FIG. 15D, the first electrode 14 and the inter-pixel insulating film 15 are formed by a technique similar to that in the above-described first embodiment. In this way, the laminated body 10 is formed on the temporary supporting plate 201, by sequentially laminating the layers starting from the second electrode 18.

Figure 16A:
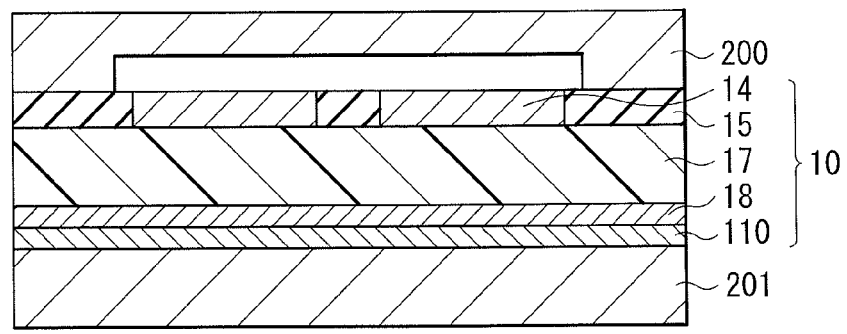
FIGS. 16A and 16B are cross-sectional diagrams illustrating a process following the process in FIGS. 15A to 15D.
Figure 16B:
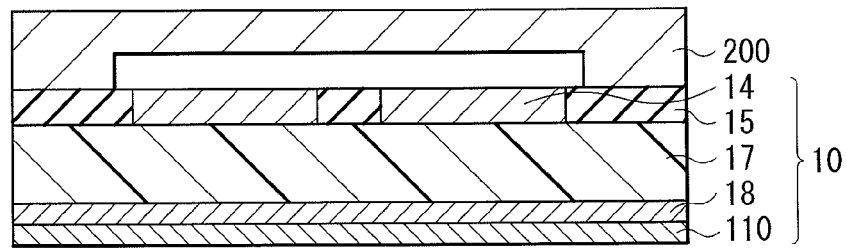

Next, as illustrated in FIG. 16A, the supporting member 200 is adhered onto the first electrode 14. Subsequently, the temporary supporting plate 201 is peeled off from the substrate 110, as illustrated in FIG. 16B. In this way, the laminated body 10 is formed on the supporting member 200.

Figure 17:
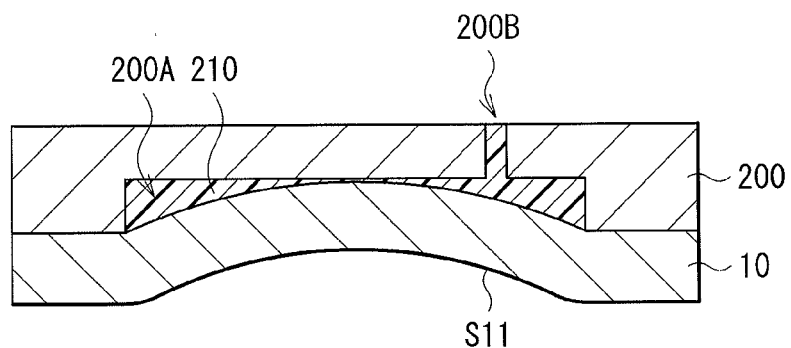
FIG. 17 is a cross-sectional diagram illustrating a process (a curve-shape forming process) following the process in FIGS. 16A and 16B.

Afterwards, as illustrated in FIG. 17, the inside of the concave section 200A is decompressed through the air vent 200B of the supporting member 200 to form a predetermined curve shape, in a manner similar to that in the above-described first embodiment.

Figure 18:
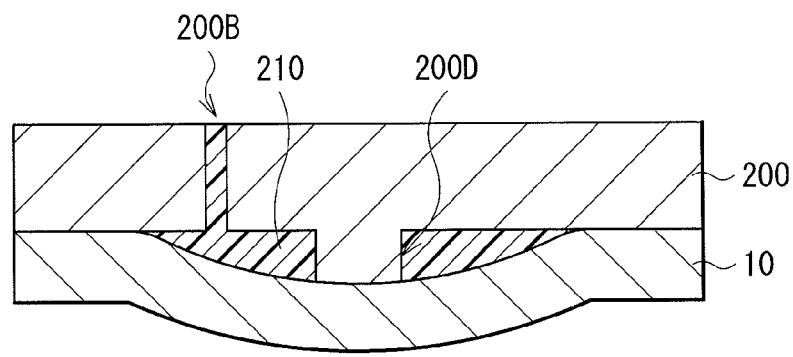
FIG. 18 is a cross-sectional diagram illustrating another example of the curve-shape forming process illustrated in FIGS. 16A and 16B.
Figure 19:
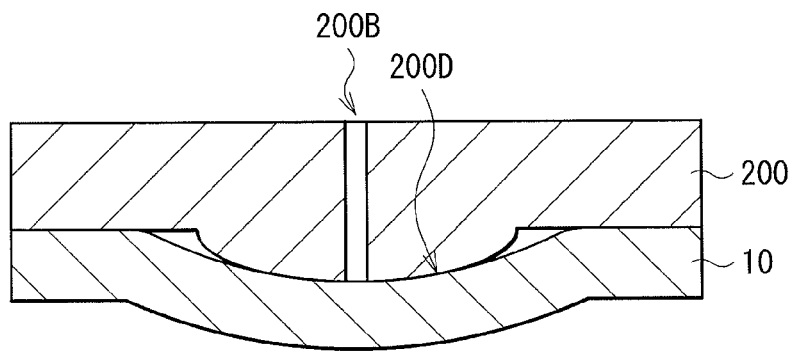
FIG. 19 is a cross-sectional diagram illustrating still another example of the curve-shape forming process illustrated in FIGS. 16A and 16B.

It is to be noted that, alternatively, a convex section 200D may be provided on the supporting member 200 as illustrated in FIG. 18 and FIG. 19, and a curve shape may be formed in the laminated body 10 using the convex section 200D. Also in this case, by forming the air vent 200B in the supporting member 200, the curve shape is allowed to be formed using molding of the convex section 200D and the pressure regulation through the air vent 200B together, so that curvature control is allowed.

Second Embodiment

Figure 20:
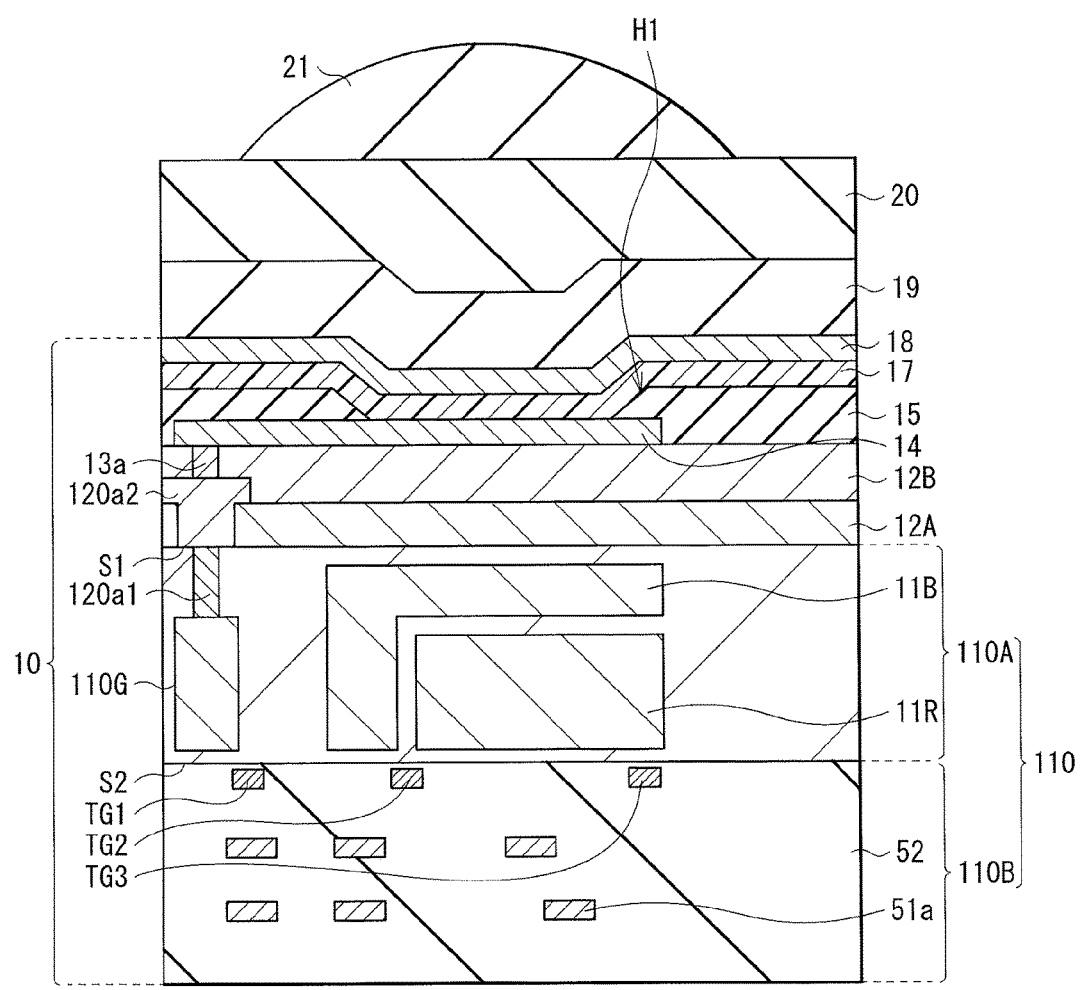
FIG. 20 is a cross-sectional diagram illustrating a schematic configuration of a solid-state image pickup device according to a second embodiment of the present disclosure.

FIG. 20 illustrates a cross-sectional configuration of a solid-state image pickup device (for one pixel) according to a second embodiment of the present disclosure. In the above-described first embodiment, the structure in which the laminated body 10 having the organic photoelectric conversion layer is formed on the substrate 110 has been described. However, in the second embodiment, a photodiode made of an inorganic semiconductor is further formed in the substrate 110. In other words, in the solid-state image pickup device of the second embodiment, an organic photoelectric conversion layer and an inorganic photoelectric conversion layer are laminated along a substrate thickness direction (a vertical direction), and rays of colors different from each other are absorbed in the respective photoelectric conversion layers.

In the solid-state image pickup device of the second embodiment, the substrate 110 includes a semiconductor layer 110A on a surface (a surface S1) on a side closer to the laminated body 10, and two photodiodes (inorganic photoelectric conversion layers 11B and 11R) are formed in the semiconductor layer 110A. The laminated body 10 is formed on the substrate 110 with interlayer insulating films 12A and 12B interposed therebetween, and a protective layer 19 and a flattening layer 20 are provided to cover the laminated body 10. An on-chip lens 21 is disposed on the flattening layer 20. In this example, an organic photoelectric conversion layer 17 selectively detects green light, and the inorganic photoelectric conversion layer 11B and the inorganic photoelectric conversion layer 11R are configured to selectively detect blue light and red light, respectively. Accordingly, in the second embodiment, signals of three colors of R, G, and B in one pixel are acquired without using a color filter.

Below the semiconductor layer 110A of the substrate 110, pixel transistors (including transfer transistors Tr1 to Tr3 which will be described later) are formed, and a multilayered wiring layer (a wiring layer 110B) is provided.

[Semiconductor Layer 110A]

The semiconductor layer 110A may be made of, for example, n-type silicon (Si), and the inorganic photoelectric conversion layers 11B and 11R as well as a green storage layer 110G are each embedded in a predetermined region thereof. In the semiconductor layer 110A, a conductive plug 120a1 serving as a transmission path of an electric charge (an electron or a hole) from an organic photoelectric conversion section 11G is also embedded. In this example, the surface S1 of the semiconductor layer 110A is a light-receiving surface (a backside-illumination type). On a surface S2 side of the semiconductor layer 110A, a plurality of pixel transistors each corresponding to each of the organic photoelectric conversion layer 17 and the inorganic photoelectric conversion layers 11B and 11R are formed, and peripheral circuits including a logic circuit and the like are formed.

Examples of the pixel transistors may include a transfer transistor, a reset transistor, an amplifying transistor, and a select transistor. These pixel transistors may be each configured of, for example, an MOS transistor. A circuit including such pixel transistors is formed for each of red, green, and blue photoelectric conversion sections. Each of these circuits may have, for example, a three-transistor configuration including three transistors in total made up of the transfer transistor, the reset transistor, and the amplifying transistor among the above-described pixel transistors, or may have a four-transistor configuration in which the select transistor is provided in addition to these three transistors.

FIG. 20 illustrates only a gate (gate electrodes TG1 to TG3) of the transfer transistor among these pixel transistors. It is to be noted that the pixel transistors except the transfer transistor may be shared among the photoelectric conversion sections or pixels. Further, a so-called pixel sharing structure in which a floating diffusion is shared is also applicable.

The transfer transistors (the three transfer transistors corresponding to the red, green, and blue photoelectric conversion sections) include the respective gate electrodes TG1 to TG3 and respective floating diffusions (not illustrated). Among these, the transfer transistor including the gate electrode TG1 (assume this is the transfer transistor Tr1) transfers a signal charge (e.g. an electron) corresponding to green, which is generated in the organic photoelectric conversion layer 17 and stored in the green storage layer 110G, to a vertical signal line Lsig described later. The transfer transistor including the gate electrode TG2 (assume this is the transfer transistor Tr2) transfers a signal charge (e.g. an electron) corresponding to blue, which is generated and stored in the inorganic photoelectric conversion layer 11B, to the vertical signal line Lsig described later. Similarly, the transfer transistor including the gate electrode TG3 (assume this is the transfer transistor Tr3) transfers a signal charge (an electron in the second embodiment) corresponding to red, which is generated and stored in the inorganic photoelectric conversion layer 11R, to the vertical signal line Lsig described later.

Each of the inorganic photoelectric conversion layers 11B and 11R is a photodiode having a pn junction. The inorganic photoelectric conversion layers 11B and 11R may be formed, for example, in the semiconductor layer 110A, in order from the surface S1 (a light incident side). Of these, the inorganic photoelectric conversion layer 11B selectively detects blue light, and stores a signal charge corresponding to blue. The inorganic photoelectric conversion layer 11B may be formed, for example, to extend from a selective region along the surface S1 of the semiconductor layer 110A to a region in proximity to an interface with the wiring layer 110B. The inorganic photoelectric conversion layer 11R selectively detects red light, and stores a signal charge corresponding to red. The inorganic photoelectric conversion layer 11R may be formed, for example, in a region below the inorganic photoelectric conversion layer 11B. It is to be noted that blue (B) and red (R) may be, for example, a color corresponding to a wavelength region of about 450 nm to about 495 nm, and a color corresponding to a wavelength region of about 620 nm to about 750 nm, respectively. Each of the inorganic photoelectric conversion layers 11B and 11R may be capable of detecting light of a part or the whole of the above-described wavelength region.

Each of the inorganic photoelectric conversion layers 11B and 11R may include, for example, a p-type semiconductor region serving as a hole storage layer and an n-type semiconductor region serving as an electron storage layer. The green storage layer 110G includes an n-type semiconductor region serving as an electron storage layer. Part of the n-type semiconductor region of the green storage layer 110G is connected to the conductive plug 120a1 and to an FD of the transfer transistor Tr1, and stores an electric charge (for example, an electron) supplied from the first electrode 14 through the conductive plug 120a1.

The conductive plug 120a1 functions as a connector between the organic photoelectric conversion section 11G and the semiconductor layer 110A, together with a conductive plug 120a2 described later, and forms a transmission path of an electron or a hole generated in the organic photoelectric conversion section 11G. In this example, the conductive plug 120a1 is electrically connected with the first electrode 14 of the organic photoelectric conversion section 11G, and is also connected to the green storage layer 110G.

The conductive plug 120a1 may be, for example, configured of an electrically-conductive semiconductor layer, and may be embedded in the semiconductor layer 110A. In this case, the conductive plug 120a1 may preferably be of an n-type, because the conductive plug 120a1 serves as an electron transmission path. Alternatively, the conductive plug 120a1 may be formed, for example, by filling a through-via with a conductive film material such as tungsten. In this case, preferably, a via side face may be covered by an insulating film made of a material such as silicon oxide ($SiO_2$) and silicon nitride (SiN), in order to suppress short circuit between the conductive film material and silicon.

The first electrode 14 is electrically connected to the conductive plug 120a1 embedded in the semiconductor layer 110A. The second electrode 18 may be, for example, connected to a wire 51a in the wiring layer 110B through a contact section (not illustrated) in a peripheral edge portion of the solid-state image pickup device, and thereby, an electric charge (in this example, a hole) is extracted.

In the interlayer insulating film 12A, the conductive plug 120a2 is embedded in a region facing the conductive plug 120a1, and in the interlayer insulating film 12B, a wiring layer 13a is embedded in a region facing the conductive plug 120a2. The first electrode 14 is disposed on the interlayer insulating film 12B. The inter-pixel insulating film 15 is provided on the first electrode 14, and an opening section H1 is provided in the inter-pixel insulating film 15 to face the first electrode 14. The organic photoelectric conversion layer 17 is formed over a region from inside (the top surface of the first electrode 14) of the opening section H1 of the inter-pixel insulating film 15 to a peripheral region.

The conductive plug 120a2 functions as the connector together with the conductive plug 120a1 as described above, and forms a transmission path of an electric charge (an electron) from the first electrode 14 to the green storage layer 110G, together with the conductive plug 120a1 and the wiring layer 13a. The conductive plug 120a2 may be allowed to function as a light-shielding film. In this case, preferably, the conductive plug 120a2 may be configured of, for example, a laminated film made of metallic materials such as titanium (Ti), titanium nitride (TiN), and tungsten.

Preferably, the interlayer insulating film 12A may be configured of an insulating film having a small interface state, in order to reduce an interface state of the interlayer insulating film 12A and the semiconductor layer 110A (a silicon layer 110), and to suppress occurrence of a dark current from the interface of the interlayer insulating film 12A and the silicon layer 110. Examples of such an insulating film may include a laminated film including a hafnium oxide ($HfO_2$) film and a silicon oxide ($SiO_2$) film. The interlayer insulating film 12B may be configured of, for example, a single layer film made of one of silicon oxide, silicon nitride, silicon oxynitride (SiON), and the like, or a laminated film made of two or more thereof.

The protective film 19 may be configured of, for example, an inorganic material having optical transparency, and may be, for example, a single-layer film made of any one of silicon oxide, silicon nitride, silicon oxynitride, and the like, or a laminated film made of two or more thereof. The protective film 19 may have, for example, a thickness of about 0.1 µm to about 30 µm both inclusive.

The flattening layer 20 may be configured of, for example, an acryl-based resin material, a styrene-based resin material, epoxy-based resin material, or the like. The on-chip lens 21 is provided on the flattening layer 20. It is to be noted that the flattening layer 20 may be provided as necessary, and the above-described protective layer 19 may also serve as the flattening layer 20.

The on-chip lens 21 condenses light incident from above, on the light-receiving surface of each of the organic photoelectric conversion layer 17G and the inorganic photoelectric conversion layers 11B and 11R. In the second embodiment, the wiring layer 110B is formed on the surface S2 side of the semiconductor layer 110A. Therefore, the light-receiving surfaces of the organic photoelectric conversion layer 17G as well as the inorganic photoelectric conversion layers 11B and 11R are allowed to be disposed close to one another, which reduces unevenness of sensitivity between the respective colors that occurs depending on an F-number of the on-chip lens 21.

[Manufacturing Method]

The solid-state image pickup device as described above may be manufactured as follows, for example. FIG. 21A to FIG. 22D illustrate a method of manufacturing the solid-state image pickup device of the second embodiment in process order.

Figure 21A:
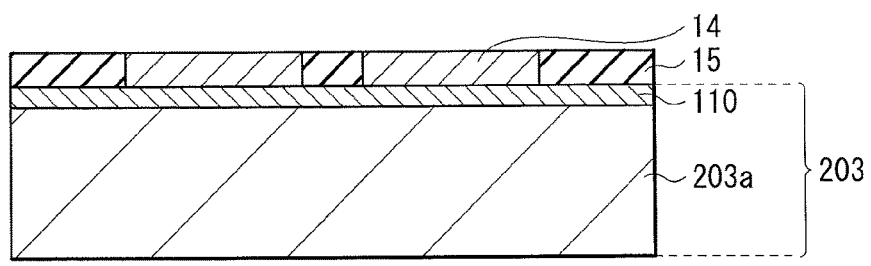
FIGS. 21A to 21C are cross-sectional diagrams used to describe a method of manufacturing the solid-state image pickup device (a process of forming a laminated body) illustrated in FIG. 20.
Figure 21B:
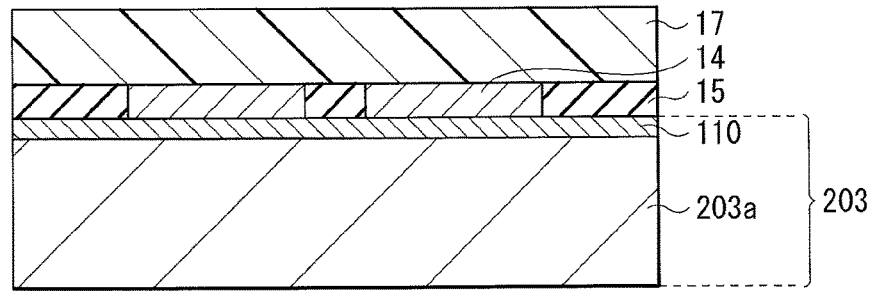
Figure 21C:
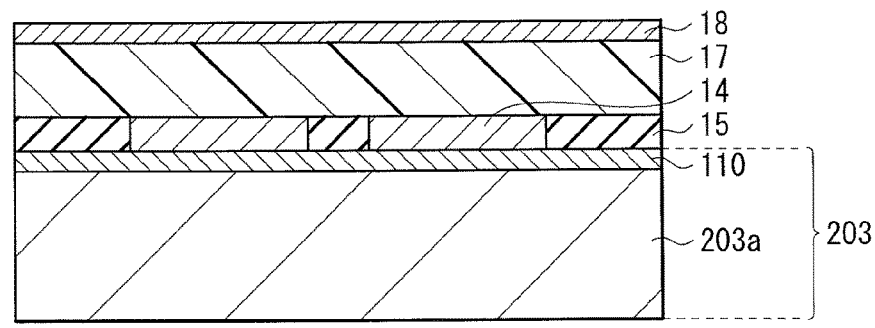

First, as illustrated in FIG. 21A, the first electrode 14 and the inter-pixel insulating film 15 are formed on a substrate 203 including a part to become the substrate 110, in a manner similar to that in the above-described first embodiment. Next, as illustrated in FIG. 21B, the organic photoelectric conversion layer 17 is formed in a manner similar to that in the above-described first embodiment. Subsequently, as illustrated in FIG. 21C, the second electrode 18 is formed in a manner similar to that in the above-described first embodiment.

Figure 22A:
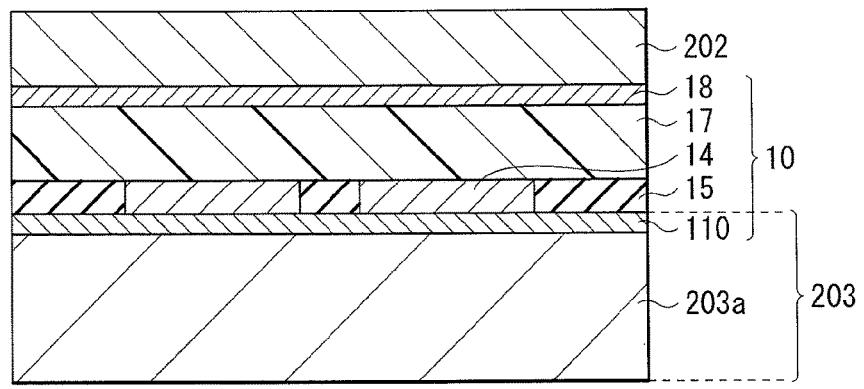
FIGS. 22A to 22D are cross-sectional diagrams illustrating a process following the process in FIGS. 21A to 21C.
Figure 22B:
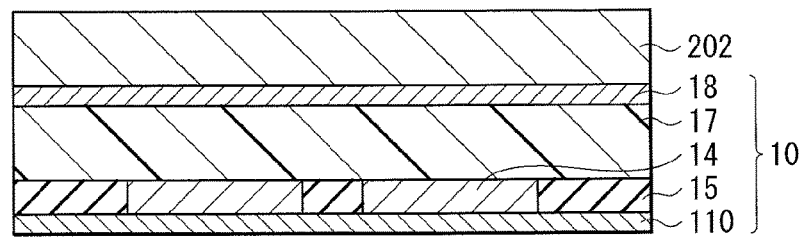
Figure 22C:
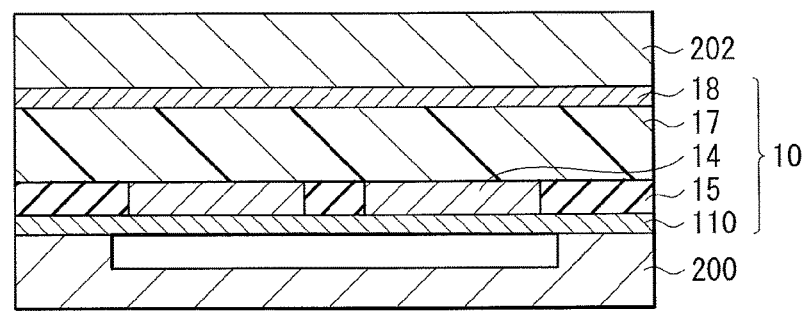
Figure 22D:
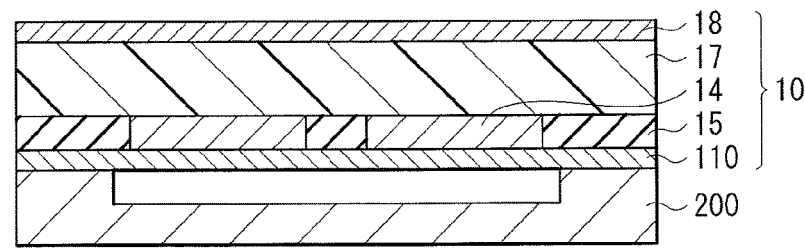

Next, a transfer layer 202 is formed on the second electrode 18 as illustrated in FIG. 22A. Subsequently, as illustrated in FIG. 22B, the substrate 203 (having a thickness of hundreds of micrometers) may be reduced in thickness by polishing, for example. At this time, of the substrate 203, the part to become the substrate 110 (a part that includes the semiconductor layer 110A and the wiring layer 110B, and has a thickness of about some micrometers to tens of micrometers) is left, and the rest (203a) is removed. After that, a supporting member 200 is adhered on the substrate 110 side as illustrated in FIG. 22C, which is followed by peeling off of the transfer layer 202 as illustrated in FIG. 22D. The laminated body 10 is thereby formed on the supporting member 200. It is to be noted that, here, illustration of the protective film 19, the flattening film 20, and the on-chip lens 21 is omitted for convenience.

Afterwards, through a curve-shape forming process similar to that of the above-described first embodiment, a predetermined curve shape is allowed to be formed in the laminated body 10 that has the organic photoelectric conversion layer 17 on the substrate 110 including the inorganic photoelectric conversion layers 11B and 11R. At this moment, the substrate 110 is sufficiently reduced in thickness and thus exhibits flexibility. Accordingly, the curve shape formation utilizing the supporting member 200 as described above is achieved.

In the solid-state image pickup device of the second embodiment, a signal charge may be obtained as follows, for example. That is, when light is incident through the on-chip lens 21, this incident light passes through the organic photoelectric conversion layer 17 as well as the inorganic photoelectric conversion layers 11B and 11R in this order, and is photoelectrically converted for each of red light, green light, and blue light while passing therethrough. Specifically, at first, green light is selectively detected (absorbed) in the organic photoelectric conversion layer 17, and photoelectrically converted. As a result, of the generated electron-hole pair, the electron, for example, may be extracted from the first electrode 14 side, and then stored in the green storage layer 110G through the wiring layer 13a as well as the conductive plugs 120a1 and 120a2. It is to be noted that the hole is extracted from the second electrode 18 side through a wiring layer not illustrated. Subsequently, of the light after passing through the organic photoelectric conversion layer 17, blue light and red light are absorbed in the inorganic photoelectric conversion layer 11B and the inorganic photoelectric conversion layer 11R, respectively, in this order. The absorbed blue light and the absorbed red light are then each photoelectrically converted and stored in the predetermined n-type semiconductor region.

It is to be noted that, in the second embodiment, the case in which green light is photoelectrically converted in the organic photoelectric conversion layer 17, and blue light and red light are photoelectrically converted in the inorganic photoelectric conversion layers 11B and 11R, respectively, has been described. However, a combination of colors (assignment of R, G, and B) for the respective photoelectric conversion layers is not limited thereto. Specifically, an organic photoelectric conversion layer performing photoelectric conversion of blue light (or red light) may be provided in the organic photoelectric conversion layer 17, and two inorganic photoelectric conversion layers performing photoelectric conversion of green light and red light (or blue light and green light), respectively, may be provided. Alternatively, two organic photoelectric conversion layers and one inorganic photoelectric conversion layer may be provided.

[Overall Configuration of Solid-State Image Pickup Device]

Figure 23:
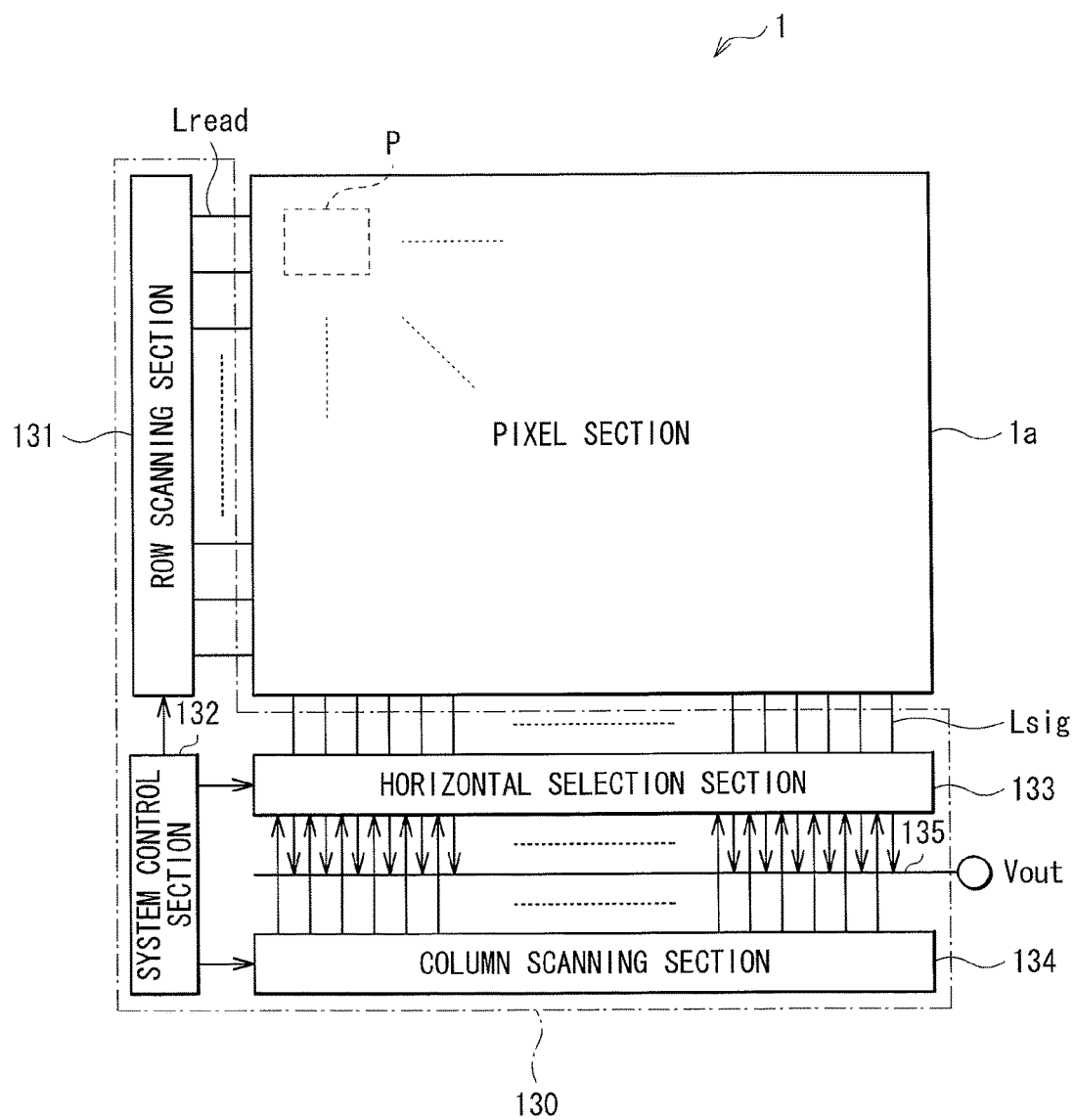
FIG. 23 is a functional block diagram including a configuration of a drive section of the solid-state image pickup device illustrated in FIG. 1.

FIG. 23 is a functional block diagram of the solid-state image pickup device according to each of the above-described embodiments. This solid-state image pickup device is a CMOS image sensor, and includes a pixel section (a photoelectric conversion section) 1a as an image pickup area. The solid-state image pickup device may include, for example, a circuit section 130. The circuit section 130 may include, for example, a row scanning section 131, a horizontal selection section 133, a column scanning section 134, and a system control section 132. The circuit section 130 may be provided in a peripheral region of the pixel section 1a, or may be provided to be laminated on the pixel section 1a (in the region facing the pixel section 1a).

The pixel section 1a may include, for example, a plurality of unit pixels P arranged two-dimensionally in rows and columns. In the unit pixel P, for example, a pixel driving line Lread (specifically, a row selecting line and a reset control line) may be wired for every pixel row, and the vertical signal line Lsig may be wired for every pixel column. The pixel driving line Lread transmits a drive signal used to read a signal from a pixel. One end of the pixel driving line Lread is connected to an output terminal, corresponding to each row, of the row scanning section 131.

The row scanning section 131 may be, for example, a pixel driving section configured of a shift register, an address decoder, and/or the like, and driving each of the pixels P in the pixel section 1a row by row. The signal outputted from each of the pixels P in a pixel row selectively scanned by the row scanning section 131 is supplied to the horizontal selection section 133 through each of the vertical signal lines Lsig. The horizontal selection section 133 is provided for each of the vertical signal lines Lsig, and configured of an amplifier, a horizontal selecting switch, and the like.

The column scanning section 134 is configured of a shift register, an address decoder, and/or the like. The column scanning section 134 sequentially drives respective horizontal selecting switches in the horizontal selection section 133 while scanning the respective horizontal selecting switches. A signal of each pixel transmitted through each of the vertical signal lines Lsig is sequentially transmitted to a horizontal signal line 135, by selection scanning performed by the column scanning section 134. The transmitted signal is then outputted to the outside through the horizontal signal line 135.

The system control section 132 receives an externally provided clock, operation-mode instructing data, and the like, and also outputs data such as internal information of a solid-state image pickup device 1. Further, the system control section 132 includes a timing generator that generates various timing signals, and performs driving control of the row scanning section 131, the horizontal selection section 133, the column scanning section 134, and the like, based on the various timing signals generated by the timing generator.

Application Example

Figure 24:
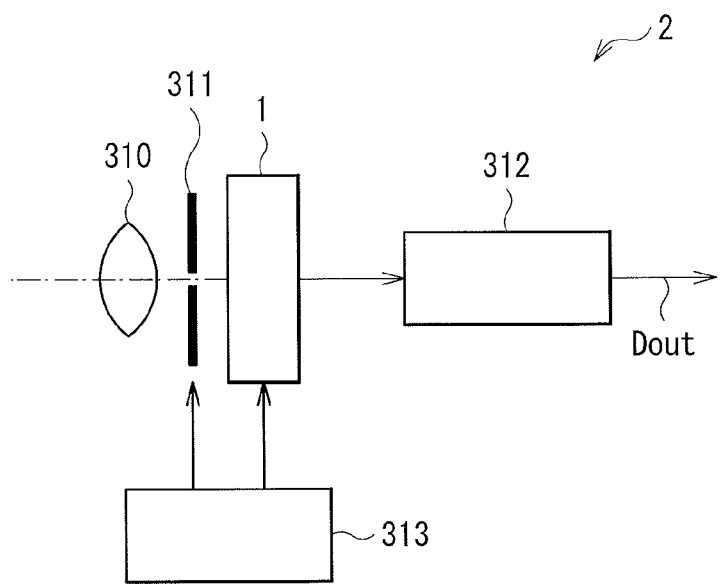
FIG. 24 is a functional block diagram of an electronic apparatus according to an application example.

Any of the above-described solid-state image pickup devices is applicable to, for example, all kinds of electronic apparatuses having an image pickup function. Examples of the electronic apparatuses may include camera systems such as digital still cameras and video camcorders, and portable telephones having an image pickup function. FIG. 24 illustrates a schematic configuration of an electronic apparatus 2 (a camera) as an example. The electronic apparatus 2 may be, for example, a video camcorder capable of shooting a still image or a moving image, and include the solid-state image pickup device 1, an optical system (an optical lens) 310, a shutter unit 311, a drive section 313 that drives the solid-state image pickup device 1 and the shutter unit 311, and a signal processing section 312.

The optical system 310 guides image light (incident light) from a subject to the pixel section 1a of the solid-state image pickup device 1. The optical system 310 may be configured of a plurality of optical lenses. The shutter unit 311 controls an optical irradiation period and a shielding period for the solid-state image pickup device 1. The drive section 313 controls transfer operation of the solid-state image sensor 1 and shutter operation of the shutter unit 311. The signal processing section 312 performs various kinds of signal processing on signals outputted from the solid-state image pickup device 1. An image signal Dout after the signal processing is stored in a storage medium such as a memory, or outputted to a monitor or the like.

The present technology has been described with reference to some embodiments and application examples, but is not limited thereto and may be variously modified. For example, in the above-described embodiments and the like, the case in which the curve-shape forming process is performed after the laminated-body forming process has been described. However, the laminated body 10 may be curved utilizing the supporting member 200, during the formation process of the laminated body (for example, immediately after the adhesion of the substrate 110 onto the supporting member 200, immediately after the formation of the first electrode 14, or immediately after the formation of the organic photoelectric conversion layer 17).

Figure 25:
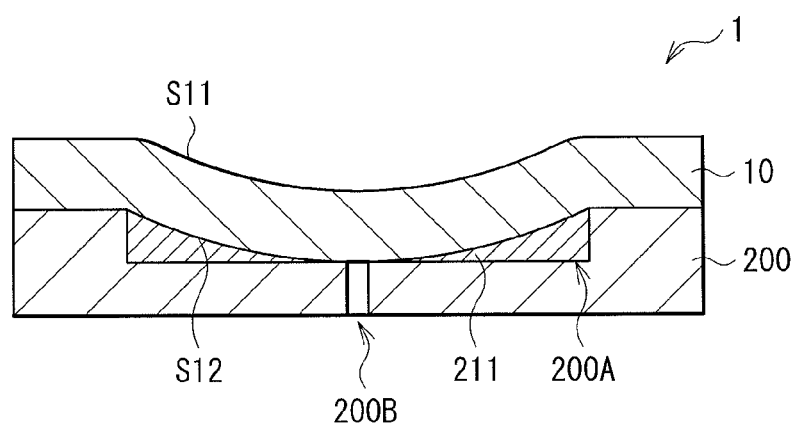
FIG. 25 is a cross-sectional diagram illustrating a configuration of a laminated body according to another modification.

Further, in the above-described embodiments and the like, the space between the supporting member 200 and the laminated body 10 is filled with the bonding layer 210. However, for example, as illustrated in FIG. 25, an actuator 211 may be disposed between the laminated body 10 and the supporting member 200, to vary the curve shape (the curvature) of the laminated body 10. Preferably, for example, an organic actuator having a bimorph structure may be used as the actuator 211. Designing in this way may allow the curvature to be varied according to an optical system, for example.

Furthermore, in the above-described embodiments and the like, the case in which the surface S11 on the light incident side of the laminated body 10 is the concave curved surface has been taken as an example. However, the surface S11 on the light incident side may be a convex curved surface.

Moreover, in the solid-state image pickup devices according to the embodiments of the present disclosure, it is not necessary to provide all the elements described in the above embodiments and the like, and other layer may be provided.

It is possible to achieve at least the following configurations from the above-described example embodiments and the modifications of the disclosure.

(1) A solid-state image pickup device including:
a laminated body including
a substrate having flexibility or plasticity,
first and second electrodes each having flexibility and each provided on one-surface side of the substrate, and
an organic photoelectric conversion layer provided between the first electrode and the second electrode, wherein
a surface on a light incident side of the laminated body includes a concave curved surface.

(2) The solid-state image pickup device according to (1), wherein the laminated body has a curve shape including the concave curved surface.

(3) The solid-state image pickup device according to (2), further including a supporting member supporting the curve shape of the laminated body and including one of a concave section and an opening that face the laminated body.

(4) The solid-state image pickup device according to (3), wherein the supporting member includes the concave section, and includes a vent in a surface, of the concave section, that faces the laminated body.

(5) The solid-state image pickup device according to (3) or (4), further including a bonding layer between the laminated body and the supporting member.

(6) The solid-state image pickup device according to any one of (2) to (5), further including an actuator adjusting a curvature of the concave curved surface by varying the curve shape.

(7) The solid-state image pickup device according to any one of (1) to (6), further including:
in the substrate, an inorganic photoelectric conversion layer configured to perform photoelectric conversion on light having a wavelength different from a wavelength of light on which the organic photoelectric conversion layer performs photoelectric conversion, wherein
the organic photoelectric conversion layer and the inorganic photoelectric conversion layer are provided along a thickness direction of the substrate.

(8) The solid-state image pickup device according to (7), wherein
the organic photoelectric conversion layer performs the photoelectric conversion on green light, and
a photoelectric conversion layer for blue light and an inorganic photoelectric conversion layer for red light are each provided as the inorganic photoelectric conversion layer in the substrate.

(9) A method of manufacturing a solid-state image pickup device, the method including:
forming a laminated body including a substrate, first and second electrodes, and an organic photoelectric conversion layer, the substrate having flexibility or plasticity, the first and second electrodes each having flexibility and being provided on one-surface side of the substrate, and the organic photoelectric conversion layer being provided between the first electrode and the second electrode; and
forming a concave curved surface at a surface on a light incident side of the laminated body.

(10) The method according to (9), wherein, in the forming of the concave curved surface, a curve shape that includes the concave curved surface is formed in the laminated body by curving the laminated body after or during the forming of the laminated body.

(11) The method according to (10), wherein the laminated body is formed on a supporting member including a concave section or an opening to allow the laminated body to face the concave section or the opening, and the laminated body is curved utilizing the supporting member.

(12) The method according to (11), wherein
the supporting member includes the concave section, and includes a vent in a surface, of the concave section, that faces the laminated body, and
the curve shape is formed in the laminated body by adjusting pressure inside the concave section with use of the vent.

(13) The method according to (11), wherein
the supporting member includes the opening, and
the curve shape is formed in the laminated body by pushing out the laminated body through the opening.

(14) The method according to any one of (11) to (13), wherein
the substrate has thermoplasticity, and
the curve shape is formed in the laminated body after the laminated body on the supporting member is subjected to an annealing treatment.

(15) The method according to (10), wherein
the substrate is made of a magnetic material, and
the curve shape is formed in the laminated body by applying a magnetic field to the laminated body.

(16) The method according to any one of (11) to (14), wherein a bonding layer is formed between the laminated body and the supporting member.

(17) The method according to any one of (11) to (14), wherein, in the forming of the laminated body, the laminated body is formed on the supporting member by forming the first electrode, the organic photoelectric conversion layer, and the second electrode in order or in reverse order, after the substrate is formed on the supporting member.
(18) The method according to any one of (11) to (17), wherein,
in the forming of the laminated body,
the laminated body is formed on a temporary supporting plate, and then
the laminated body is formed on the supporting member by transferring the laminated body onto the supporting member and peeling off the temporary supporting plate from the laminated body.
(19) The method according to any one of (11) to (18), wherein
an inorganic photoelectric conversion layer is provided in the substrate, the inorganic photoelectric conversion layer being configured to perform photoelectric conversion on light having a wavelength different from a wavelength of light on which the organic photoelectric conversion layer performs photoelectric conversion, and
after the forming of the laminated body, the substrate is reduced in thickness, and then, the laminated body is transferred onto the supporting member.
(20) An electronic apparatus with a solid-state image pickup device, the solid-state image pickup device including:
a laminated body including
a substrate having flexibility or plasticity,
first and second electrodes each having flexibility and each provided on one-surface side of the substrate, and
an organic photoelectric conversion layer provided between the first electrode and the second electrode, wherein
a surface on a light incident side of the laminated body includes a concave curved surface.
[1] An image sensor, comprising:
a plurality of photoelectric conversion elements included in a laminated body, wherein at least one of the photoelectric conversion elements includes organic photoelectric conversion elements;
wherein the laminated body includes first and second surfaces that are opposite one another,
wherein at least the first surface of the laminated body includes a curved light incident surface,
wherein the curved light incident surface includes a concave surface, and
wherein the plurality of photoelectric conversion elements receive light through the concave light incident surface.
[2] The image sensor of [1], wherein the organic photoelectric conversion elements include a first electrode, an organic photoelectric conversion film, and a second electrode, and wherein the first electrode, the organic photoelectric conversion film, and the second electrode are flexible.
[3] The image sensor of [2], further comprising a flexible substrate.
[4] The image sensor of any one of [1] to [3], wherein all of the photoelectric conversion elements are organic photoelectric conversion elements.
[5] The image sensor of any one of [1] to [4], further comprising a plurality of pixels, wherein each of the pixels includes at least one organic photoelectric conversion element.
[6] The image sensor of [5], further comprising:
a plurality of color filters, wherein at least one of the photoelectric conversion elements in each of the pixels is associated with a color filter.
[7] The image sensor of [5] or [6], wherein for each pixel the photoelectric conversion elements are sensitive to light in a different set of wavelengths.
[8] The image sensor of any one of [5] to [7], wherein for each pixel the photoelectric conversion elements are layered.
[9] The image sensor of any one of [1] to [8], further comprising a plurality of pixels wherein each of the pixels includes at least one organic photoelectric conversion element and at least one photodiode.
[10] The image sensor of [9], wherein for each of the pixels:
at least one of the organic photoelectric conversion elements is sensitive to green light, a first photodiode receives light that has passed through the organic photoelectric conversion element and is sensitive to blue light, and a second photodiode receives light that has passed through the organic photoelectric conversion element and the first photodiode and is sensitive to red light.
[11] The image sensor of any one of [1] to [10], further comprising a supporting member, wherein the supporting member includes a concave section and a top surface, and wherein the laminated body is joined to the top surface of the support structure.
[12] The image sensor of [11], further comprising an actuator disposed between the laminated body and a portion of the supporting member.
[13] An electronic apparatus, comprising:
an optical system;
a solid-state image sensor, wherein the solid-state image sensor receives light from the
optical system, and includes:
a concave light incident surface;
a plurality of pixels, wherein each of the pixels includes at least one organic photoelectric conversion element;
a shutter unit, wherein the shutter unit controls an irradiation of the solid-state image sensor with light from the optical system;
a drive section, wherein the drive section controls operation of the shutter unit and transfer operations of the solid-state image sensor; and
a signal processing section, wherein the signal processing section performs signal processing operations on signals outputted from the solid-state image sensor.
[14] The apparatus of [13], wherein all of the photoelectric conversion elements are organic photoelectric conversion elements.
[15] The apparatus of [14], wherein the solid state image sensor is flexible.
[16] The apparatus of [13] or [14], wherein each of the pixels includes at least one photo diode in addition to the at least one organic photoelectric conversion element.
[17] A method of manufacturing an image sensor having a curved light incident surface and pixels that each include at least one organic photoelectric conversion element, comprising:
providing a supporting member;
forming a laminated body, wherein forming the laminated body includes:
providing a substrate;
forming a plurality of first electrodes on the substrate, wherein each of the first electrodes are separated from one another by an inter-pixel insulating film;
forming an organic photoelectric conversion layer on the first electrodes and the inter-pixel insulating film;
forming a second electrode on the organic photoelectric conversion layer;

forming a curved shape in the laminated body, wherein forming the curved shape includes:
joining the laminated body to the supporting member;
softening the laminated body.

[18] The method of [17], wherein the laminated body is formed on the supporting member.

[19] The method of [17] or [18], wherein the supporting member includes a top surface and a concave section, and wherein forming a curved shape in the laminated body further includes:
joining the laminated body to the support member such that the laminated body is placed on the top surface of the supporting member, wherein a chamber is formed between the concave section of the supporting member and a portion of the laminated body.

[20] The method of [19], wherein forming a curved shape in the laminated body further includes:
withdrawing air from the chamber between the concave section of the supporting member and the portion of the laminated body through an air hole formed in the supporting member.

[21] The method of [19] or [20], wherein forming a curved shape in the laminated body further includes:
adjusting a pressure of the chamber between the concave section of the supporting member and the portion of the laminated body.

[22] The method of any one of [17] to [21], wherein forming a curved shape in the laminated body further includes:
inserting a press member through a hole in the supporting member, wherein the curved shape is formed by pressing the press member against the laminated body.

[23] The method of any one of [17] to [22], wherein the substrate includes a magnetic material, and wherein forming a curved shape in the laminated body further includes applying a magnetic field to create the curved shape in the laminated body.

[24] The method of any one of [17] to [23], wherein the supporting member includes a convex section, and wherein forming a curved shape in the laminated body further includes:
joining the laminated body to the support member such that the laminated body is placed on the convex section of the supporting member.

The present disclosure contains subject matter related to that disclosed in Japanese Priority Patent Application JP 2012-267867 filed in the Japan Patent Office on Dec. 7, 2012, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. An image sensor, comprising:
a supporting member that comprises an air vent, wherein the air vent is configured to provide an outlet for air;
a laminated body; and
a plurality of photoelectric conversion elements included in the laminated body,
wherein the laminated body includes a first surface and a second surface opposite to the first surface,
wherein at least the first surface of the laminated body includes a curved light incident surface,
wherein each of the plurality of photoelectric conversion elements are configured to receive light through the curved light incident surface,
wherein each of the plurality of photoelectric conversion elements include a first electrode, an organic photoelectric conversion film, and a second electrode on a substrate, the first electrode is adjacent to the supporting member and the second electrode is adjacent to the substrate,
wherein a first peripheral portion of the second surface of the laminated body is coupled to a second peripheral portion of the supporting member,
wherein a first central portion of the second surface of the laminated body is spaced apart from a second central portion of the supporting member, and
wherein a curvature of the curved light incident surface of the laminated body is controlled based on a regulation of air pressure in a space between the first central portion of the second surface of the laminated body and the second central portion of the supporting member.

2. The image sensor of claim 1, wherein the first electrode, the organic photoelectric conversion film, and the second electrode are flexible.

3. The image sensor of claim 1, wherein the laminated body further includes the substrate that is flexible.

4. The image sensor of claim 1, wherein the plurality of photoelectric conversion elements are organic photoelectric conversion elements.

5. The image sensor of claim 1, further comprising a plurality of pixels, wherein each pixel of the plurality of pixels includes at least one organic photoelectric conversion element.

6. The image sensor of claim 5, further comprising:
a plurality of color filters, wherein at least one of the plurality of photoelectric conversion elements in each of the plurality of pixels is associated with a color filter of the plurality of color filters.

7. The image sensor of claim 5, wherein, for each pixel of the plurality of pixels, the plurality of photoelectric conversion elements are sensitive to light in a different set of wavelengths.

8. The image sensor of claim 5, wherein, for each pixel of the plurality of pixels, the plurality of photoelectric conversion elements are layered.

9. The image sensor of claim 1, further comprising a plurality of pixels, wherein each pixel of the plurality of pixels includes at least one organic photoelectric conversion element and at least one photodiode.

10. The image sensor of claim 9, wherein for each pixel of the plurality of pixels:
the at least one organic photoelectric conversion element is sensitive to green light, a first photodiode is configured to receive light that has passed through the at least one organic photoelectric conversion element and is sensitive to blue light, and a second photodiode is configured to receive light that has passed through the at least one organic photoelectric conversion element and the first photodiode and is sensitive to red light.

11. The image sensor of claim 1, wherein the second central portion of the supporting member includes a concave section, wherein the second peripheral portion of the supporting member includes a top surface, wherein the air vent is present in the concave section of the supporting member, and wherein the laminated body is adhered to the top surface of the supporting member.

12. The image sensor of claim 11, further comprising an actuator between the laminated body and a portion of the supporting member, wherein the actuator is configured to vary the curvature of the curved light incident surface of the laminated body.

13. An electronic apparatus, comprising:
an optical system;
a solid-state image sensor, wherein the solid-state image sensor is configured to receive light from the optical system, and wherein the solid-state image sensor includes:
- a supporting member that comprises an air vent, wherein the air vent is configured to provide an outlet for air; and
- a laminated body, the laminated body including:
  - a curved light incident surface;
  - a plurality of photoelectric conversion elements; and
  - a plurality of pixels, wherein each pixel of the plurality of pixels includes at least one organic photoelectric conversion element, wherein the curved light incident surface is a first surface of the laminated body,
  - wherein each of the plurality of photoelectric conversion elements includes a first electrode, an organic photoelectric conversion film, and a second electrode, on a substrate, the first electrode is adjacent to the supporting member and the second electrode is adjacent to the substrate,
  - wherein a first peripheral portion of a second surface of the laminated body is coupled to a second peripheral portion of the supporting member,
  - wherein a first central portion of the second surface of the laminated body is spaced apart from a second central portion of the supporting member, and
  - wherein a curvature of the curved light incident surface of the laminated body is controlled based on a regulation of air pressure in a space between the first central portion of the second surface of the laminated body and the second central portion of the supporting member;
a shutter unit configured to control an irradiation of the solid-state image sensor with the light from the optical system;
a drive section configured to control operation of the shutter unit and transfer operations of the solid-state image sensor; and
a signal processing section configured to process signals output from the solid-state image sensor.

14. The electronic apparatus of claim 13, wherein the plurality of photoelectric conversion elements are organic photoelectric conversion elements.

15. The electronic apparatus of claim 13, wherein the laminated body is flexible.

16. The electronic apparatus of claim 13, wherein each pixel of the plurality of pixels further includes at least one photo diode in addition to the at least one organic photoelectric conversion element.

17. The image sensor of claim 1, wherein the space between the first central portion of the second surface of the laminated body and the second central portion of the supporting member is filled with a bonding layer.

* * * * *